(12) United States Patent
Yamakawa

(10) Patent No.: US 8,242,558 B2
(45) Date of Patent: Aug. 14, 2012

(54) SEMICONDUCTOR DEVICE AND METHOD FOR PRODUCTION OF SEMICONDUCTOR DEVICE

(75) Inventor: Shinya Yamakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 117 days.

(21) Appl. No.: 12/491,652

(22) Filed: Jun. 25, 2009

(65) Prior Publication Data
US 2009/0321820 A1 Dec. 31, 2009

(30) Foreign Application Priority Data
Jun. 30, 2008 (JP) ................................. 2008-169793

(51) Int. Cl.
*H01L 29/78* (2006.01)
(52) U.S. Cl. ................. 257/330; 257/368; 257/E21.621
(58) Field of Classification Search ................. 257/330, 257/332, 334, 368, E21.619, E21.621, E21.624; 438/589
See application file for complete search history.

(56) References Cited

U.S. PATENT DOCUMENTS

| | | | | |
|---|---|---|---|---|
| 6,716,046 | B2* | 4/2004 | Mistry | 439/270 |
| 7,361,973 | B2* | 4/2008 | Chidambarrao et al. | 257/623 |
| 7,767,535 | B2* | 8/2010 | Matsuo | 438/306 |
| 2002/0037619 | A1* | 3/2002 | Sugihara et al. | 438/289 |
| 2004/0129959 | A1* | 7/2004 | Kim et al. | 257/288 |
| 2007/0023841 | A1* | 2/2007 | Kim | 257/368 |
| 2007/0108514 | A1* | 5/2007 | Inoue et al. | 257/330 |
| 2007/0166941 | A1* | 7/2007 | Park | 438/372 |
| 2010/0181619 | A1* | 7/2010 | Wei et al. | 257/347 |

FOREIGN PATENT DOCUMENTS

| | | |
|---|---|---|
| JP | 2003-227571 | 10/1991 |
| JP | 11-251454 | 9/1999 |
| JP | 2000-315789 | 11/2000 |
| JP | 2002-198368 | 7/2002 |
| JP | 2004-140059 | 5/2004 |
| JP | 2005-026707 | 1/2005 |
| JP | 2005-057301 | 3/2005 |
| JP | 2005-353675 | 12/2005 |
| JP | 2006-165335 | 6/2006 |
| JP | 2006-186240 | 7/2006 |
| JP | 2006-269768 | 10/2006 |
| JP | 2007-081330 | 3/2007 |
| JP | 2007-103654 | 4/2007 |

(Continued)

OTHER PUBLICATIONS

Japanese Patent Office corresponding to Japanese Serial No. 2008-169793 dated Oct. 12, 2010.
Wang, J. et al., "Novel Channel—Stress Enhancement Technology with eSiGe S/D and Recessed Channel on Damacene Gate Process"; Symposium on VLSI Technology Digest of Technical Papers; 2007; pp. 46-47.

(Continued)

*Primary Examiner* — Evan Pert
*Assistant Examiner* — Scott Stowe
(74) *Attorney, Agent, or Firm* — SNR Denton US LLP

(57) ABSTRACT

Disclosed herein is a semiconductor device including: a gate electrode formed in a recess dug in the surface of a semiconductor substrate, with a gate insulating film interposed between the gate electrode and the semiconductor substrate; a source-drain diffusion layer formed on that surface of the semiconductor substrate which is adjacent to both sides of the gate electrode; and a stress applying layer which is formed deep from the surface of the semiconductor substrate in such a way as to cover the surface of the source-drain diffusion layer.

12 Claims, 19 Drawing Sheets

FOREIGN PATENT DOCUMENTS

| | | |
|---|---|---|
| JP | 2007-294680 | 11/2007 |
| JP | 2008-193060 | 8/2008 |
| JP | 2009-152394 | 7/2009 |
| WO | 2006/081012 | 8/2006 |
| WO | 2008/072573 | 6/2008 |

OTHER PUBLICATIONS

Japanese Office Action issued on Jan. 18, 2011 in connection with counterpart JP Application No. 2008-169793.

* cited by examiner

SEMICONDUCTOR DEVICE AND METHOD FOR PRODUCTION OF SEMICONDUCTOR DEVICE

BACKGROUND OF THE INVENTION

1. Field of the Invention

The present invention relates to a semiconductor device and a method for production thereof. More particularly, the present invention relates to a semiconductor device of field-effect transistor structure and a method for production thereof, the semiconductor device having improved carrier mobility that results from stress applied to the channel part in the semiconductor substrate.

2. Description of the Related Art

Integrated circuits with field-effect transistors are becoming miniaturized continuously in pursuit of such advantages as higher speed, less power consumption, lower production cost, and smaller size. Now, the miniaturization has reached the stage where it is technically possible to produce transistors having the gate length shorter than 100 nm. Moreover, the roadmap of ITRS (International Technology Roadmap for Semiconductors) envisages that the transistor called 32 nm node will have a gate length shorter than 20 nm.

The reduction of gate length is also accompanied by the downsizing (scaling) of the device structure itself. However, reducing the gate length from the order of submicron to the order of 100 nm or less is impeded by the physical thickness of the silicon oxide ($SiO_2$) insulating film, which is conventionally used as the gate insulating film, from the standpoint of suppressing gate leak current.

Possible ways under study to reduce the effective thickness of the gate insulating film are by making the gate insulating film from hafnium oxide, which has a high dielectric constant (high-K), thereby raising the dielectric constant of the gate insulating film, or by making the gate insulating film from a metallic material, thereby preventing the gate electrode from depletion.

The method for preventing the gate electrode from depletion is being investigated by making the gate electrode from such metallic materials as tungsten (W), titanium (Ti), hafnium (Hf), ruthenium (Ru), and iridium (Ir). Unfortunately, these metallic materials react with the gate insulating film upon heat treatment at a high temperature, thereby deteriorating the gate insulating film and fluctuating the threshold voltage. This problem is involved in the heat treatment for activation of impurities that is carried out in the process in related art in which the gate electrode is formed and then the impurity diffusion layer, such as source-drain region, is formed.

One way proposed so far to address the problem with the gate electrode of metallic material is the damascene gate process which is intended to form the source-drain region and then form the gate electrode (see Japanese Patent Laid-open Nos. 2000-315789 and 2005-26707). According to the damascene gate process, the source-drain region is formed, with a dummy gate formed previously. Then an interlayer insulating film that covers the dummy gate is formed, and subsequently it is polished so that the dummy gate is exposed. The dummy gate is removed by etching, and in the removed part are formed a new gate insulating film and a gate electrode. This process protects the gate electrode from the effect of heat treatment to activate impurities in the formation of the source-drain region.

On the other hand, there are some techniques which are being actively used to increase the carrier mobility in the channel part by application of stress to the channel part in the silicon substrate.

One of such techniques is composed of forming a trench in the silicon substrate adjacent to the gate electrode having a side wall and forming in the trench by epitaxial growth the source-drain which is a semiconductor layer differing in lattice constant from silicon (Si). The semiconductor layer constituting the source-drain formed in this manner applies stress to the channel part (see Japanese Patent Laid-open No. 2006-186240).

There is another technique proposed so far. It is concerned with a MOS (Metal Oxide Semiconductor) transistor Tr formed on the surface of the substrate 101 as shown in FIG. 11. The transistor Tr has the silicide layer 103 on its source-drain (S/D), and the transistor Tr and the substrate 101 are covered with the stress liner film 105 which applies stress. The stress liner film 105 is that of tensile stress type or compressive stress type depending on whether the MOS transistor (Tr) is that of n-channel type or p-channel type, respectively. This structure permits the silicide layer 103 and the stress liner film 105 to apply stress to the channel part (ch) of the transistor (Tr) (see Japanese Patent Laid-open Nos. 2002-198368, 2005-57301, 2006-165335 and 2006-269768).

SUMMARY OF THE INVENTION

The above-mentioned technology to apply stress to the channel part has the disadvantage that the stress to be applied to the channel part from the semiconductor layer, which is formed as the source-drain in the trench, or from the silicide layer and the stress applying film, is weakened by the counteraction from the gate electrode which is formed above the channel part. Thus, stress application to the channel part from the semiconductor layer, silicide layer, or stress applying film is not effectively accomplished, and hence improving carrier mobility is not achieved.

The present invention was completed in view of the foregoing. It is desired for the present invention to provide a semiconductor device and a method for production thereof, the semiconductor device being designed such that stress is effectively applied to the channel part to achieve improved carrier mobility and high performance.

According to an embodiment of the present invention, the semiconductor device is composed of a semiconductor substrate, a gate electrode formed thereon with a gate insulating film interposed therebetween, and a source-drain diffusion layer formed on that surface of the semiconductor substrate which is adjacent to the gate electrode. Of these components, the gate electrode is formed, with a gate insulating film interposed thereunder, in a recess formed by digging the surface of the semiconductor substrate. The source-drain diffusion layer is covered with the stress applying layer which is formed deep from the surface of the semiconductor substrate.

The semiconductor device constructed as mentioned above has the gate insulating film and the gate electrode which fill the recess formed by digging the surface of the semiconductor substrate, so that the channel part is positioned deep from that surface of the semiconductor substrate which is adjacent to both sides of the gate electrode. As a result, the channel part receives a concentrated stress from the stress applying layer formed deep from that surface of the semiconductor substrate which is adjacent to both sides of the gate electrode. The result is that stress can be applied to the channel part more effectively from the stress applying layer than in the structure in related art having the channel part formed at approximately the same height as the surface of the semiconductor substrate.

In addition, according to another embodiment of the present invention, the method for producing the semiconductor device is characterized by the following steps. The first step to form the dummy gate electrode on the semiconductor substrate and then form the source-drain diffusion layer on that surface of the semiconductor substrate which is adjacent to both sides of the dummy gate electrode. The second step to form the stress applying layer on the surface layer of the source-drain diffusion layer. The stress applying layer is positioned deep from the surface of the semiconductor substrate within the depth of the source-drain diffusion layer. The third step to form the interlayer insulating film which covers the dummy gate electrode and the stress applying layer and then cause the dummy gate electrode to expose itself from the interlayer insulating film and further remove the dummy gate electrode, thereby forming a groove pattern in the interlayer insulating film. The fourth step to dig down that surface of the semiconductor substrate which exposes itself at the bottom of the groove pattern. The fifth step to form a new gate electrode in the groove pattern, in which the exposed surface of the semiconductor substrate has been dug down, with the gate insulating film interposed thereunder.

In the foregoing procedure, the third step removes the dummy gate electrode, with the stress applying layer formed. This prevents the stress applied from the stress applying layer to that part of the semiconductor substrate which is under the gate electrode from being weakened by the counteraction from the dummy gate electrode. The result is that stress is applied effectively from the stress applying layer to that part of the substrate which is between semiconductor layers. Moreover, the fourth step to dig down further that part of the semiconductor substrate which is under the dummy gate electrode permits, after the gate insulating film and the gate electrode have been formed in the fifth step, the channel part to be positioned deep from the surface of the semiconductor substrate between layers to which the stress is effectively applied. The result is that the channel part receives a concentrated stress that is applied to that part of the semiconductor substrate which is between the semiconductor layers throughout the depthwise direction of the stress applying layer. Therefore, stress from the stress applying layer can be applied to the channel part effectively and concentratedly.

Further embodiment of the present invention may be implemented for production of the semiconductor device by another method that includes the following steps. The first step to dig the surface of the semiconductor substrate, thereby forming a recess. The second step to form the dummy gate electrode in the recess and form the source-drain diffusion layer in that surface layer of the semiconductor substrate which is adjacent to both sides of the dummy gate electrode. The third step to form the stress applying layer in the source-drain diffusion layer. (The stress applying layer is deep from the surface of the semiconductor substrate within the depth of the source-drain diffusion layer.) The fourth step to form the interlayer insulating film that covers the dummy gate electrode and the stress applying layer, allow the dummy gate electrode to expose itself from the interlayer insulating film, and remove the dummy gate electrode, thereby forming a groove pattern which overlaps the recess in the semiconductor substrate. The fifth step to form a new gate electrode, with a gate insulating film interposed thereunder, in the groove pattern including the recess in the semiconductor substrate.

In the foregoing procedure, the fourth step removes the dummy gate electrode, with the stress applying layer formed. This prevents the stress applied from the stress applying layer to that part of the semiconductor substrate which is under the gate electrode from being weakened by the counteraction from the dummy gate electrode. The result is that stress is applied effectively from the stress applying layer to that part of the substrate which is between semiconductor layers. Moreover, the fifth step to form a new gate electrode, with a gate insulating film interposed thereunder, in the groove pattern including the recess in the semiconductor substrate, permits the channel part to be positioned deep from the surface of the substrate between layers to which stress is applied. (The channel part is that part to which stress is effectively applied.) The result is that the channel part receives a concentrated stress that is applied to that part of the semiconductor substrate which is between the semiconductor layers throughout the depthwise direction of the stress applying layer. Therefore, stress from the stress applying layer can be applied to the channel part effectively and concentratedly.

As mentioned above, the present invention permits stress to be applied effectively to the channel part from the stress applying layer adjacent to both sides of the gate electrode. This leads to improvement in carrier mobility and hence to improvement in performance of the semiconductor device.

DETAILED DESCRIPTION OF THE PREFERRED EMBODIMENTS

In what follows, embodiments of the present invention will be described in more detail with reference to the accompanying drawings. The description of each embodiment covers first the structure of the semiconductor device and then the method for production of the semiconductor device.

Structure of the Semiconductor Device According to the First Embodiment

Figure 1:
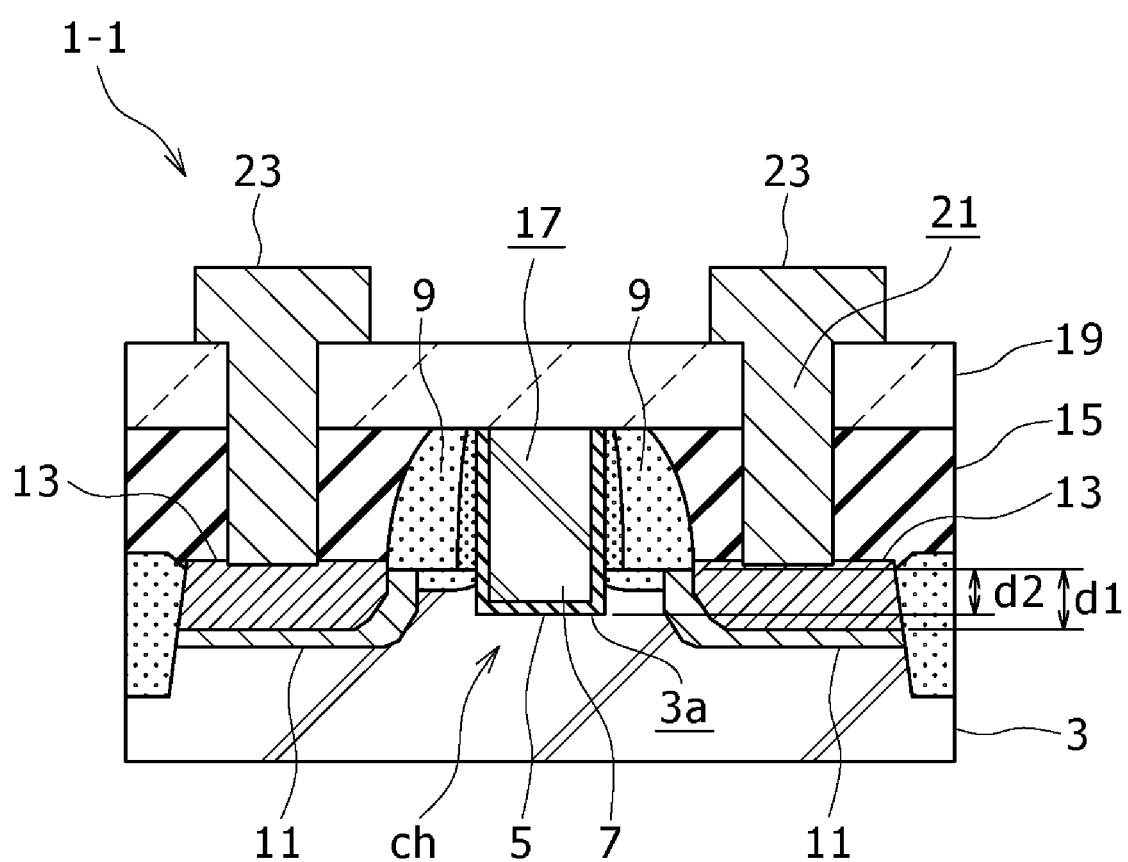
FIG. 1 is a sectional view showing a semiconductor device according to a first embodiment.

FIG. 1 is a sectional view showing important parts of the semiconductor device 1-1 according to the first embodiment of the present invention. The semiconductor device 1-1 shown in this figure is a semiconductor device of field-effect transistor type. It is constructed in the following manner.

The semiconductor device is formed on the semiconductor substrate 3 of single crystal silicon. The semiconductor substrate 3 has the recess 3a which is formed by digging the surface thereof. On the semiconductor substrate 3 is formed the gate electrode 7 which fills the recess 3a, with the gate insulating film 5 interposed therebetween. On both sides of the gate electrode 7 are formed the insulating side walls 9. On that surface of the semiconductor substrate 3, which is adjacent to both sides of the gate electrode 7 having the side walls 9, is formed the source-drain diffusion layer 11. The source-drain diffusion layer 11 has its surface covered with the silicide film 13.

In the first embodiment, the silicide film 13 functions as the stress applying layer to apply stress to the channel part ch in that part of the semiconductor substrate 3 which is under the gate electrode 7. The silicide film (stress applying layer) 13 is formed by the steps to be detailed later in the section of production method. It is formed by converting into silicide the exposed surface of the semiconductor substrate 3 on which the source-drain diffusion layer 11 has been formed. It has a sufficient depth d1 from the surface of the semiconductor substrate 3 within the depth of the source-drain diffusion layer 11.

Assuming that d1 denotes the depth of the silicide film (stress applying layer) 13 from the surface of the semiconductor substrate 3 and d2 denotes the depth of the recess 3a in which the gate insulating film 5 and the gate electrode 7 are buried (or the depth of the channel ch), then the relation of [d2]<[d1] should hold. The optimal depth d2 of the channel part ch within the above-specified range should be experimentally established so that a maximum stress is applied to the channel part ch.

The silicide film 13 is formed from a silicide of cobalt (Co), nickel (Ni), or platinum (Pt). The silicide film 13 of such composition functions as the stress applying layer that applies tensile stress to the semiconductor substrate 3 of single crystal silicon. Therefore, the semiconductor device 1-1 having the silicide film 13 is favorably used for the field-effect transistor of n-channel type. Incidentally, if the silicide film 13 is one which applies a compressive stress, the semiconductor device 1-1 having it is favorably used for the field-effect transistor of p-channel type.

The gate insulating film 5 and the gate electrode 7 are of damascene gate structure, and the gate electrode 7 has the insulating side walls 9. In this structure, the interlayer insulating film 15, which covers the semiconductor substrate 3 and the silicide film (stress applying layer) 13, has the groove pattern 17 whose side walls are defined by the side walls 9. The bottom of the groove pattern 17 is at the bottom of the recess 3a which has been formed by digging the semiconductor substrate 3. The gate insulating film 5 is so formed as to cover the inner wall including the bottom of the groove pattern 17, and the gate electrode 7 is so formed as to fill the groove pattern 17, with the gate insulating film 5 interposed therebetween.

Incidentally, the semiconductor device 1-1 may be one which is optionally covered with the upper layer insulating film 19. In this case, the structure may be modified such that the connecting hole 21 reaching the silicide film (stress applying layer) 13 is formed in the upper layer insulating film 19 and the interlayer insulating film 15 and the wiring 23 is formed which is connected to the source-drain diffusion layer 11 through the silicide film (stress applying layer) 13 at the bottom of the connecting hole 21.

The high dielectric insulating film constituting the gate insulating film 5 may be one which is formed from oxide, oxysilicide, oxynitride, or oxynitridesilicide containing at least one species selected from aluminum (Al), yttrium (Y), zirconium (Zr), lanthanum (La), hafnium (Hf), and tantalum (Ta). To be specific, it is exemplified by $HfO_2$, $ZrO_2$, $La_2O_3$, $Y_2O_3$, $Ta_2O_5$, $Al_2O_3$, $HfSiO_x$, $ZrSiO_x$, $ZrTiO_x$, $HfAlO_x$, $ZrAlO_x$, and a nitride thereof such as HfSiON. These materials slightly vary in dielectric constant depending on their composition and crystallinity. For example, $HfO_2$ and $ZrO_2$ have a dielectric constant of 25 to 30 and 20 to 25, respectively. Incidentally, the gate insulating film 5 may be of laminate structure composed of silicon oxide film and high dielectric (High-K) insulating film.

The major metallic layer constituting the gate electrode 7 may be formed from such metal as Ti, Ru, Hf, Ir, Co, W, Mo, La, Ni, Cu, and Al, or Si compounds or N compounds thereof, or a combination thereof. In the case of laminate structure, it may be combined with more than one metallic film which controls the work function of the gate electrode as a work function regulating layer or controls the threshold voltage, thereby reducing the resistance of the gate electrode. Such metallic films should be in contact with the gate insulating film.

In the case of field-effect transistor of n-type, the work function of the gate electrode 7 should be no higher than 4.6 eV, preferably no higher than 4.3 eV. By contrast, in the case of field-effect transistor of p-type, the work function of the gate electrode 7 should be no lower than 4.6 eV, preferably no lower than 4.9 eV. It is desirable that the difference between n-type and p-type in the work function of the gate electrode 7 should be no less than 0.3 eV.

In the case where the gate electrode 7 is of laminate structure, with the lower layer being the work function regulating layer, the work function regulating layer should be formed from any metal selected from Ti, V, Ni, Zr, Nb, Mo, Ru, Hf, Ta, W, and Pt, and alloys containing them, which has an adequate work function. Other materials include compounds of the metals, such as metal nitride and metal silicide (a compound of metal and semiconductor).

To be specific, the gate electrode 7 of the field-effect transistor of n-type should preferably be formed from Hf or Ta or alloy thereof or compound thereof, more preferably from $HfSi_x$. The work function of HfSi varies depending on its composition and crystallinity; it is usually about 4.1 to 4.3 eV.

Also, the gate electrode 7 of the field-effect transistor of p-type should preferably be formed from Ti, Mo, or Ru or alloy thereof or compound thereof, more preferably from TiN or Ru. The work function of TiN varies depending on its composition and crystallinity; it is usually about 4.5 to 5.0 eV.

Therefore, in the case where a field-effect transistor of p-type and a field-effect transistor of n-type are formed on the semiconductor substrate 3, the gate electrode of at least one of them may have the laminate structure which includes a layer to control the work function of the gate electrode. Incidentally, in the case where both the field-effect transistor of p-type and the field-effect transistor of n-type have the layer to control the work function of the gate electrode, the respective gate electrode should be so constructed as to have the work function suitable for each of them.

In the semiconductor device 1-1 constructed as mentioned above, the channel part ch, which is adjacent to the interface with the gate insulating film 5 in the semiconductor substrate 3, is formed deep from the surface of the semiconductor substrate 3 within the thickness of the silicide film (stress applying layer) 13.

The consequence of this structure is that stress applied to that part of the semiconductor substrate 3 which corresponds to the thickness of the silicide film (stress applying layer) 13 is concentrated to the channel part ch positioned half way in the depthwise direction of the silicide film (stress applying layer) 13. Thus the foregoing structure permits stress to be applied to the channel part ch from the silicide film (stress applying layer) 13 more effectively than the structure in related art in which the channel part is at approximately the same height as the surface of the semiconductor substrate 3.

As a result, the carrier mobility is improved regardless of the concentration of the material constituting the silicide film (stress applying layer) 13. And this contributes to the improved performance of the semiconductor device 1-1.

Figure 2A:
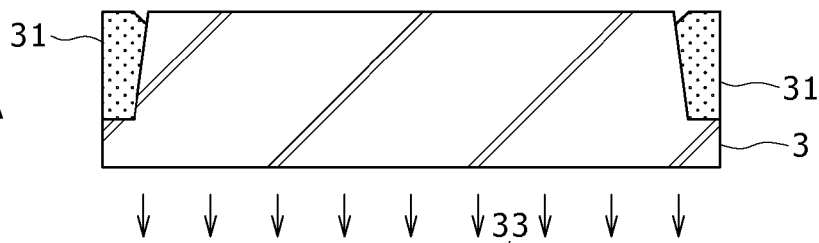
FIGS. 2A to 2P are sectional views showing a first example of the production method according to the first embodiment.
Figure 2B:
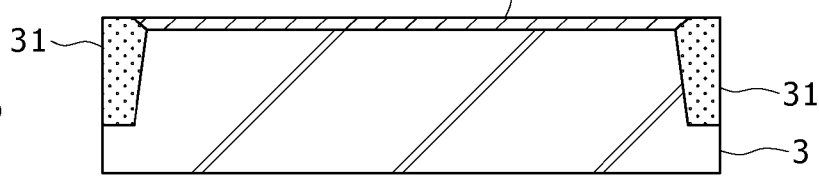
Figure 2C:
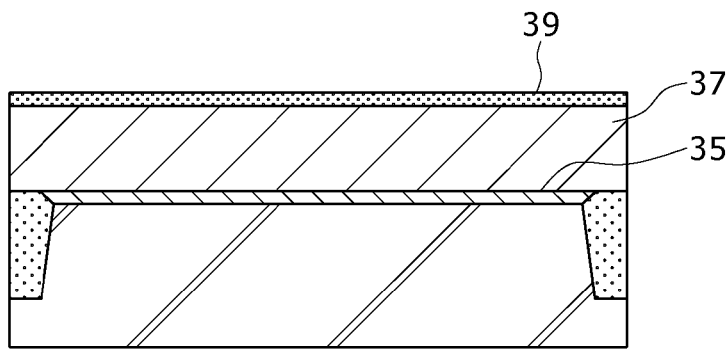
Figure 2D:
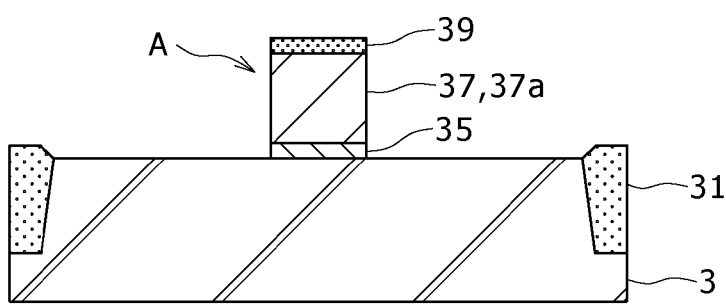
Figure 2E:
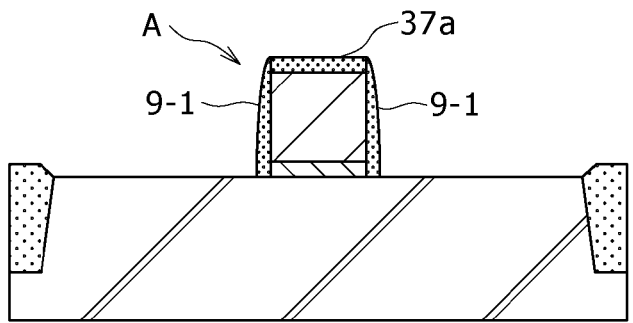
Figure 2F:
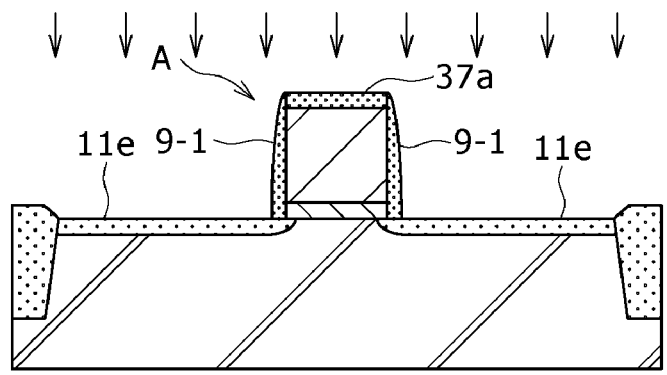
Figure 2G:
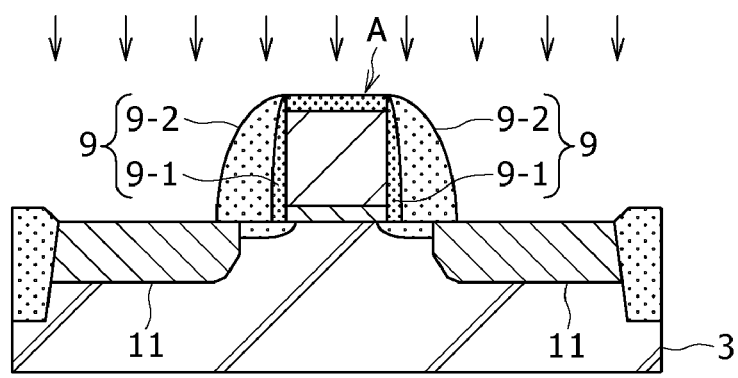
Figure 2H:
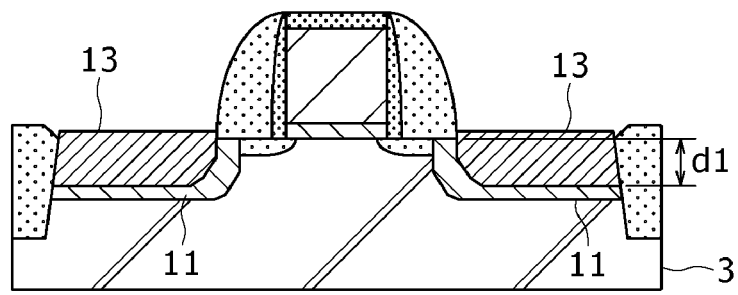
Figure 2I:
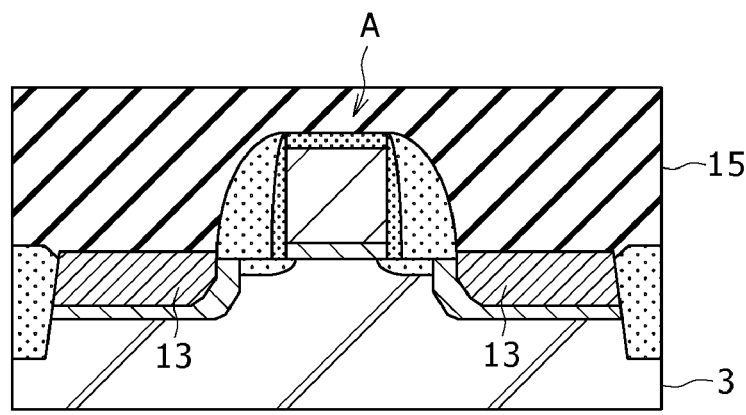
Figure 2J:
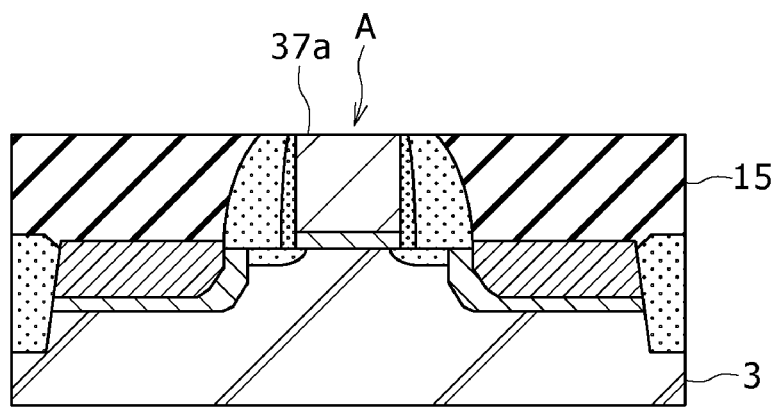
Figure 2K:
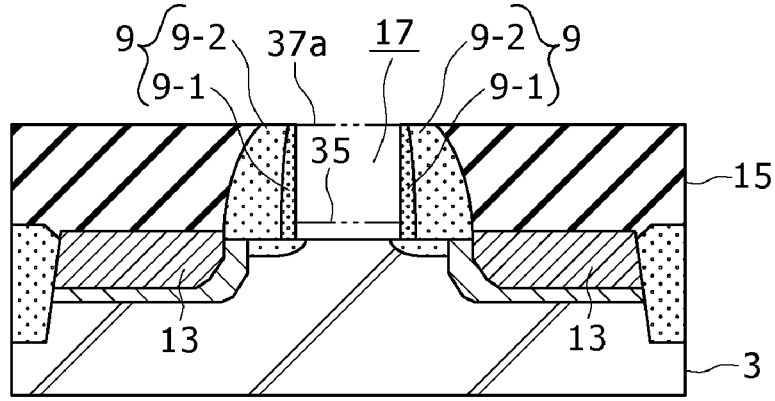
Figure 2L:
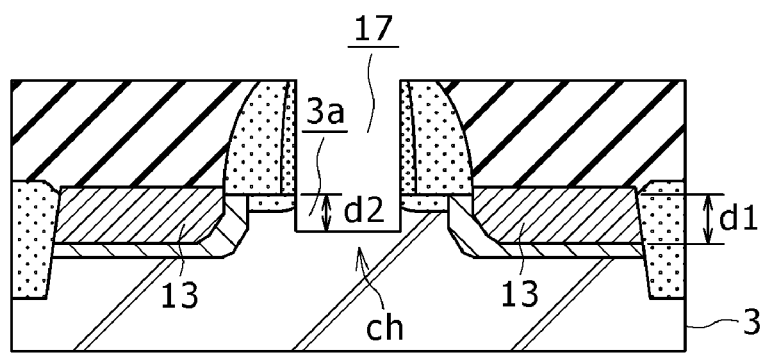
Figure 2M:
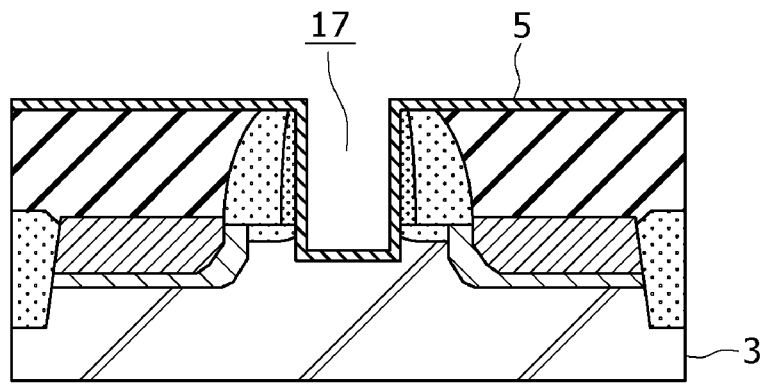
Figure 2N:
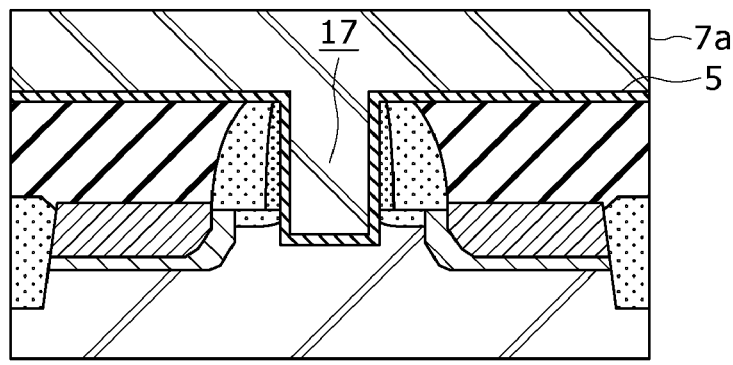
Figure 2O:
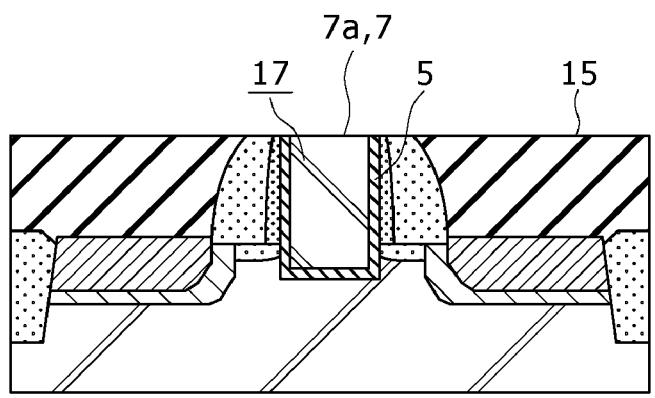
Figure 2P:
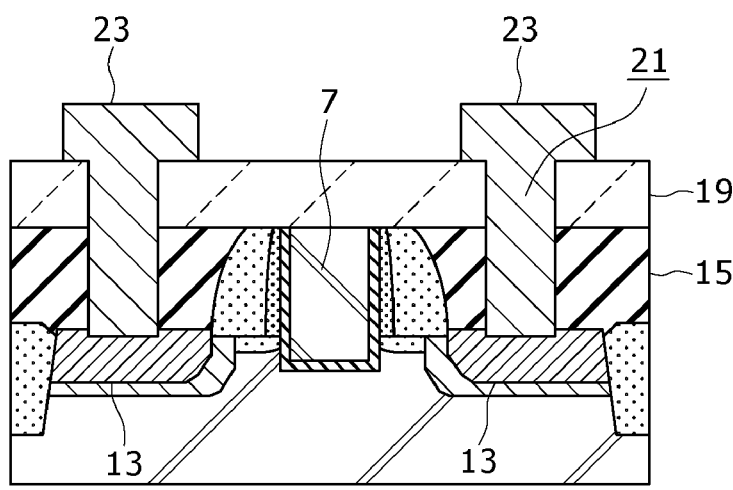

Method for Production of the Semiconductor Device According to the First Embodiment FIGS. 2A to 2P are sectional views showing the steps of the method for producing the semiconductor device 1-1 according to the first embodiment which has been explained above with reference to FIG. 1. The same symbols as used in FIG. 1 are used for the corresponding elements in FIGS. 2A to 2P.

The first step shown in FIG. 2A is to form the isolation 31 of STI (Shallow Trench Isolation) structure, which is silicon oxide film filling the groove in the surface of the semiconductor substrate 3 of single crystal silicon.

The next step shown in FIG. 2B is to form by surface oxidation the protective film 33 (about 5 to 10 nm thick) of silicon oxide that prevents channeling. This step is followed by ion implantation with impurities, such as phosphorus (P), arsenic (As), boron (B), and indium (In), for adjustment of threshold value. An adequate impurity for ion implantation is selected for the region in which is formed the field-effect transistor of n-channel type and the region in which is formed the field-effect transistor of p-channel type. The former and latter regions will be referred to as nMOS region and pMOS region, respectively. After ion implantation, the protective film 33 is removed.

The next step shown in FIG. 2C is to form by thermal oxidation the dummy gate insulating film 35 (about 1 to 3 nm thick) of silicon oxide. Then, it is covered by CVD (Chemical Vapor Deposition) process with the dummy gate electrode film 37 (about 100 to 150 nm thick) of polysilicon or amorphous silicon. It is further covered by CVD process with the hard mask layer 39 (about 30 to 100 nm thick) of silicon nitride.

The next step shown in FIG. 2D is to form the dummy gate structure A by pattern etching the hard mask layer 39, the dummy gate electrode film 37, and the dummy gate insulating film 35 into the shape of the gate electrode.

The pattern etching is accomplished in the following way. First, a resist pattern for the gate electrode is formed on the hard mask layer 39 by optical lithography or electron beam lithography. This resist pattern is used as a mask to perform etching on the hard mask layer 39 and to pattern the hard mask layer 39. The thus patterned hard mask layer 39 is used to perform etching on the dummy gate electrode film 37, thereby forming the dummy gate electrode 37a, and further to pattern the dummy gate insulating film 35. This patterning is performed by dry etching with an adequate selectivity which hardly attacks the hard mask layer 39. The patterning of the dummy gate electrode film 37 is accomplished by etching which uses the dummy gate insulating film 35 as the stopper. In this way it is possible to prevent the etching from damaging that part of the surface of the semiconductor substrate 3 which is adjacent to both sides of the dummy gate structure A.

The next step shown in FIG. 2E is to form the first insulating side walls 9-1 on the sides of the dummy gate structure A. The side walls 9-1 may be formed by forming a silicon nitride film (about 1 to 10 nm thick) by CVD process and performing etch-back on it by anisotropic etching (dry etching), such that the silicon nitride film remains only on the sides of the dummy gate structure A. Incidentally, the first side walls 9-1 may be formed from a deposited silicon oxide film by etch-back. Alternatively, they may be formed by oxidization of the side walls of the dummy gate electrode 37a.

Incidentally, the first side walls 9-1 are optional and they may be formed according to need, because they are only necessary to adjust the position of the extension when the extension is formed in the source-drain region later.

The next step shown in FIG. 2F is to introduce by ion implantation an impurity into the surface layer of the semiconductor substrate 3 in order to form the extension 11e in the source-drain region. The impurity used in this step is a p-type impurity, such as B and In, for the pMOS region and an n-type impurity, such as As and P, for the nMOS region. The ion implantation is accomplished with an energy of about 0.5 to 2 keV and a dose of about $5 \times 10^{14}$ to $2 \times 10^{15}$ ions/cm$^2$.

The next step shown in FIG. 2G is to form the second insulating side walls 9-2 on outer sides of the first side walls 9-1 by forming a silicon nitride film by CVD process and performing etch-back thereon. Incidentally, the first side walls 9-1 and the second side walls 9-2 will be collectively referred to as the side walls 9, hereinafter.

The step shown in FIG. 2G is followed by ion implantation with an impurity such as P, As, and B to form the source-drain diffusion layer 11. This ion implantation is followed by heat treatment at 900 to 1100° C. for 60 seconds or less for activation of the implanted impurity. Incidentally, the impurity used in this step is a p-type impurity, such as B and In, for the pMOS region and an n-type impurity, such as As and P, for the nMOS region.

The next step shown in FIG. 2H is to form the metal silicide film 13 as the stress applying layer on the surface of the source-drain diffusion layer 11 by salicide process. The metal for the metal silicide film 13 is selected from cobalt (Co), nickel (Ni), and platinum (Pt). This metal silicide film 13 reduces the contact resistance of the source-drain diffusion layer 11. As the silicide forming process proceeds, it causes the silicide film (stress applying layer) 13 to grow in the depthwise direction in the surface of the source-drain diffusion layer 11 or the surface of the semiconductor substrate 3 of single crystal silicon. Therefore, it is important that the silicide film (stress applying layer) 13 should be sufficiently grown down to the depth (d1) from the surface of the semiconductor substrate 3 within the depth of the source-drain diffusion layer 11.

The next step shown in FIG. 2I is to form the interlayer insulating film 15 of silicon oxide in such a way as to bury therein the dummy gate structure A and the silicide film (stress applying layer) 13.

The next step shown in FIG. 2J is to polish the surface of the interlayer insulating film 15 by CMP (Chemical Metal Polishing) process until the dummy gate electrode 37a of the dummy gate structure A exposes itself.

The next step shown in FIG. 2K is to remove by dry etching the dummy gate electrode 37a of polysilicon or amorphous silicon and then remove by wet etching the dummy gate insulating film 35 of silicon oxide. In this way, the groove pattern 17 is formed after removal of the dummy gate structure A in the interlayer insulating film 15 that covers the semiconductor substrate 3 and the silicide film (stress applying layer) 13, and the semiconductor substrate 3 is allowed to expose itself at the bottom of the groove pattern 17. This groove pattern 17 has its side wall defined by the side wall 9 (9-1 and 9-2).

The next step shown in FIG. 2L is to dig (by recess etching) the exposed surface of the semiconductor substrate 3 at the bottom of the groove pattern 17, thereby forming the recess 3a in the semiconductor substrate 3. Thus the groove pattern 17 is dug at the position away from the silicide film (stress applying layer) 13.

The digging should be accomplished in such a way that the relation of [d2]<[d1] holds, wherein d1 denotes the depth of the silicide film (stress applying layer) 13 from the surface of the semiconductor substrate 3 and d2 denotes the depth of the recess 3a (or the channel depth d2). Incidentally, the optimal value for the channel depth d2 of the recess 3a within the range specified above should be obtained experimentally so that a maximum stress is applied to the channel part of the MOS transistor (field-effect transistor) to be formed herein.

The recess etching is accomplished by forming a silicon oxide film (about 1 to 2 nm thick) on the semiconductor substrate 3 of single crystal silicon by oxidation in a plasma atmosphere and then removing the silicon oxide film by wet etching with hydrofluoric acid. The steps of plasma oxidation and wet etching may be repeated as many times as necessary according to the channel depth d2. In this way it is possible to prevent damages to the exposed surface of the semiconductor substrate 3 which arises from recess etching. Moreover, the plasma oxidation should be performed at no higher than 500° C. so as to prevent the impurity from diffusing again by heat.

Incidentally, the surface oxidation of the semiconductor substrate 3 may be accomplished by oxidation with ozone or gas as well as the plasma oxidation mentioned above. This oxidation may also be achieved by direct etching (or dry etching) of the silicon surface.

The next step shown in FIG. 2M is to form the gate insulating film 5 in such a way as to cover the inside wall of the groove pattern 17 which has been formed by digging the surface of the semiconductor substrate 3. It is desirable to form the gate insulating film 5 from the above-mentioned high dielectric material by CVD process or ALD (Atomic Layer Deposition) process.

The next step shown in FIG. 2N is to form the gate electrode material film 7a, with the gate insulating film 5 placed thereunder, in such a way as to fill the inside of the groove pattern 17. The gate electrode material film 7a is a metal layer for the metal gate, which is formed by CVD process, PVD (Phisical Vapor Deposition) process, or ALD process. It may be of single layer structure or multilayer structure. It may be formed from any material mentioned above about the structure of the device.

The next step shown in FIG. 2O is to polish by CMP the gate electrode material film 7a and the gate insulating film 5 until the interlayer insulating film 15 exposes itself. In this way it is possible to form the gate electrode 7 in the groove pattern 17, with the gate electrode material film 7a remaining which is in contact with the gate insulating film 5.

The step just mentioned above may be followed by an optional step of forming the upper layer insulating film 19 of silicon oxide in such a way as to cover the interlayer insulating film 15 and the gate electrode 7, as shown in FIG. 2P. Then, the connecting hole 21, which reaches the silicide film (stress applying layer) 13, is formed in the upper layer insulating film 19 and the interlayer insulating film 15. Further, the plug that fills the connecting hole 21 and the wiring 23 for its connection are formed.

The forgoing steps yield the semiconductor device 1-1 which has been described above with reference to FIG. 1. It has the gate electrode 7 which is formed in the recess 3a dug in the surface of the semiconductor substrate 3, with the gate insulating film 5 surrounding it. It also has the silicide film (stress applying layer) 13 which is formed deep from the surface of the semiconductor substrate 3 in such a way as to cover the surface of the source-drain diffusion layer 11 adjacent to both sides of the gate electrode 7.

The above-mentioned production method offers the following advantages. As explained with reference to FIG. 2K, the dummy gate structure A is removed while the silicide film (stress applying layer) 13 remains. Therefore, the stress that is applied to that part of the semiconductor substrate 3 which is under the dummy gate structure A from the silicide film (stress applying layer) 13 is not weakened by the counteraction from the dummy gate electrode 37a. As a result, the stress from the silicide film (stress applying layer) 13 is effectively applied to the channel part ch.

Moreover, as explained with reference to FIG. 2L, after the dummy gate structure A has been removed, the semiconductor substrate 3 at the bottom of the groove pattern 17 is dug down further, so that the channel part ch is positioned deep from the surface of the semiconductor substrate 3. As a result, the channel part ch concentratedly receives the stress which is applied to that part of the semiconductor substrate 3 within the silicide film (stress applying layer) 13 in the depthwise direction of the silicide film (stress applying layer) 13. Therefore, the resulting semiconductor device 1-1 is constructed such that the stress from the silicide film (stress applying layer) 13 is effectively and concentratedly applied to the channel part ch.

Structure of the Semiconductor Device According to the Second Embodiment

Figure 3:
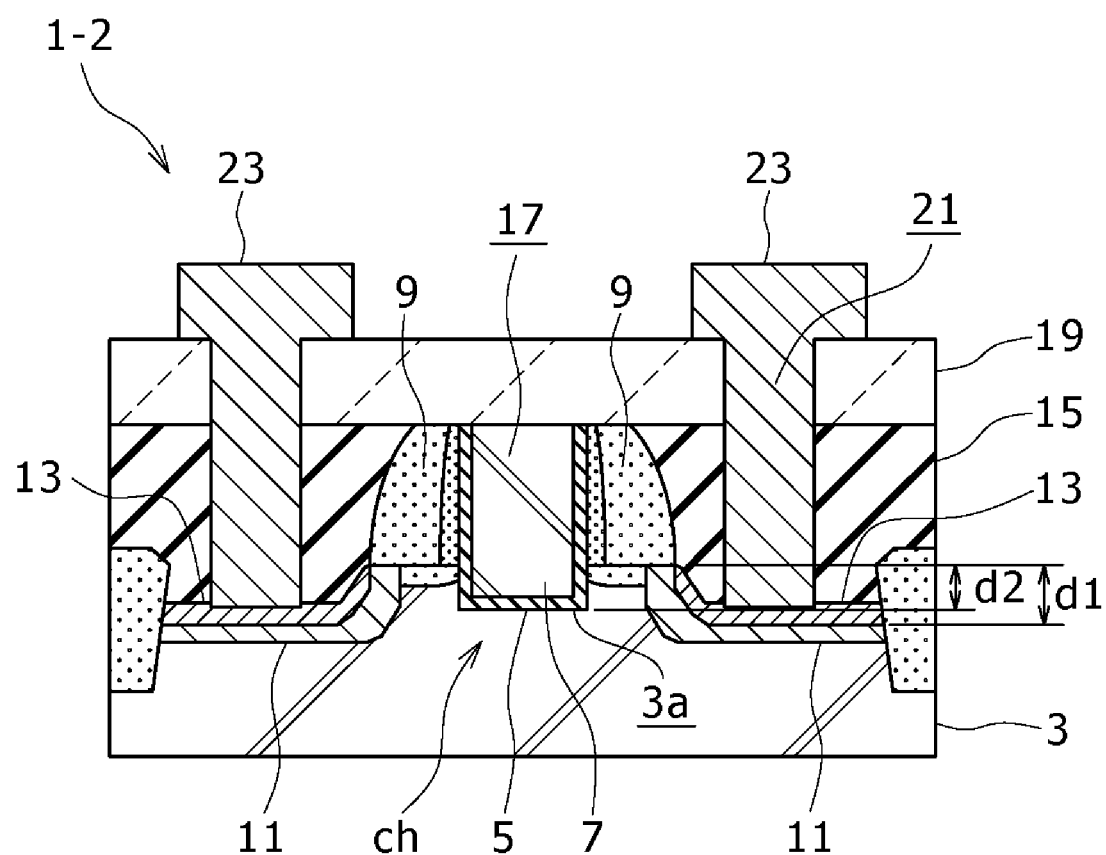
FIG. 3 is a sectional view showing a semiconductor device according to a second embodiment.

FIG. 3 is a sectional view showing important parts of the semiconductor device 1-2 according to the second embodiment of the present invention. The semiconductor device 1-2 shown in this figure is a semiconductor device of field-effect transistor type. It differs from that according to the first embodiment explained above with reference to FIG. 1 in that that part of the surface of the semiconductor substrate 3 on which there are formed the source-drain diffusion layer 11 and the silicide film (stress applying layer) 13 is dug by recess etching. Except for this, its structure is identical with the structure according to the first embodiment.

As in the first embodiment, the semiconductor device is formed on the semiconductor substrate 3 of single crystal silicon. The semiconductor substrate 3 has the recess 3a which is formed by digging the surface thereof. On the semiconductor substrate 3 is formed the gate electrode 7 which fills the recess 3a, with the gate insulating film 5 therebetween. On both sides of the gate electrode 7 are formed the insulating side walls 9. In the second embodiment, that surface of the semiconductor substrate 3, which is adjacent to both sides of the gate electrode 7 having the side walls 9, has the recess dug by recess etching. And the source-drain diffusion layer 11 is formed adjacent to the surface which has been dug. The source-drain diffusion layer 11 has its surface covered with the silicide film 13.

In the second embodiment, the silicide film 13 also functions as the stress applying layer to apply stress to the channel part ch in that part of the semiconductor substrate 3 which is under the gate electrode 7. The silicide film (stress applying layer) 13 is formed by the steps to be detailed later in the section of production method. It is formed by converting into silicide the exposed surface of the semiconductor substrate 3 on which the source-drain diffusion layer 11 has been formed.

It has a sufficient depth d1 from the surface of the semiconductor substrate 3 within the depth of the source-drain diffusion layer 11.

Assuming that d1 denotes the depth of the silicide film (stress applying layer) 13 from the surface of the semiconductor substrate 3 and d2 denotes the depth of the recess 3a in which the gate insulating film 5 and the gate electrode 7 are buried (or the depth of the channel part ch), then the relation of [d2]<[d1] should hold as in the first embodiment. The optimal depth d2 of the channel part ch should be experimentally established so that a maximum stress is applied to the channel part ch as in the first embodiment.

Incidentally, according to the second embodiment, it is desirable that the bottom of the recess 3a should be positioned within the thickness of the silicide film (stress applying layer) 13 or between the surface of the silicide film (stress applying layer) 13 and the position (back side) of the depth d1.

In this case, too, as in the first embodiment, the silicide film 13 is formed from a silicide of cobalt (Co), nickel (Ni), or platinum (Pt). The silicide film 13 of such composition functions as the stress applying layer that applies tensile stress to the semiconductor substrate 3. It can be favorably used for the field-effect transistor of n-channel type. On the other hand, if the silicide film 13 is one which applies a compressive stress, the semiconductor device 1-2 having it is favorably used for the field-effect transistor of p-channel type.

As in the first embodiment, the gate insulating film 5 and the gate electrode 7 are of damascene gate structure, and the gate electrode 7 has the insulating side walls 9. In this structure, the interlayer insulating film 15, which covers the semiconductor substrate 3 and the silicide film (stress applying layer) 13, has the groove pattern 17 whose side walls are defined by the side walls 9. The bottom of the groove pattern 17 is at the bottom of the recess 3a which has been formed by digging the semiconductor substrate 3. The gate insulating film 5 is so formed as to cover the inner wall including the bottom of the groove pattern 17, and the gate electrode 7 is so formed as to fill the groove pattern 17, with the gate insulating film 5 interposed therebetween.

Incidentally, the semiconductor device 1-2 may be one which is optionally covered with the upper layer insulating film 19. In this case, the structure may be modified such that the connecting hole 21 reaching the silicide film (stress applying layer) 13 is formed in the upper layer insulating film 19 and the interlayer insulating film 15 and the wiring 23 is formed which is connected to the source-drain diffusion layer 11 through the silicide film (stress applying layer) 13 at the bottom of the connecting hole 21.

As in the first embodiment, the gate insulating film 5 should preferably be formed from a high dielectric (High-K) material in order to reduce the effective film thickness while maintaining the physical film thickness. The high dielectric material is the same one as used in the first embodiment.

The gate electrode 7 is identical in structure and material with that in the first embodiment.

In the semiconductor device 1-2 constructed as mentioned above, too, the channel part ch, which is adjacent to the interface with the gate insulating film 5 in the semiconductor substrate 3, is formed deep from the surface of the semiconductor substrate 3 within the thickness of the silicide film (stress applying layer) 13.

The consequence of this structure is that stress applied to that part of the semiconductor substrate 3 which corresponds to the thickness of the silicide film (stress applying layer) 13 is concentrated to the channel part ch positioned half way in the depthwise direction of the silicide film (stress applying layer) 13. Thus the foregoing structure permits stress to be applied to the channel part ch from the silicide film (stress applying layer) 13 more effectively than the structure in related art in which the channel part is at approximately the same height as the surface of the semiconductor substrate 3.

As a result, the carrier mobility is improved regardless of the concentration of the material constituting the silicide film (stress applying layer) 13. And this contributes to the improved performance of the semiconductor device 1-2.

Figure 4A:
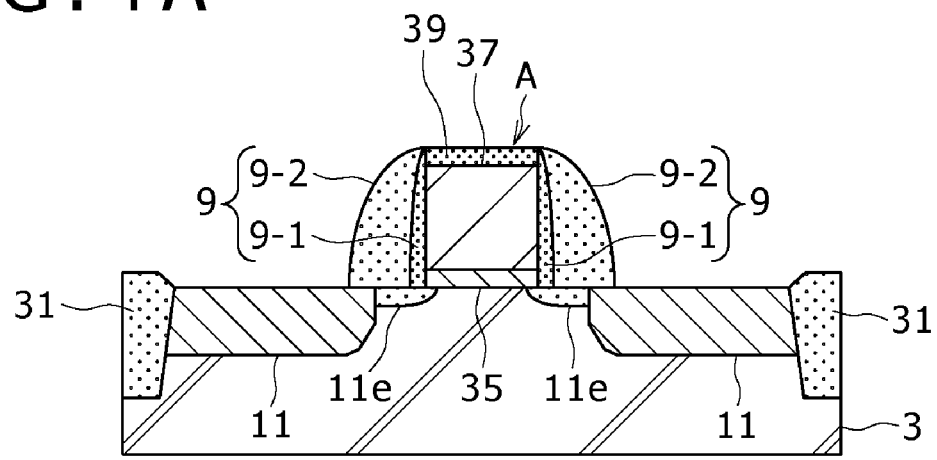
FIGS. 4A to 4C are sectional views showing the characteristic steps in the production method according to the second embodiment.
Figure 4B:
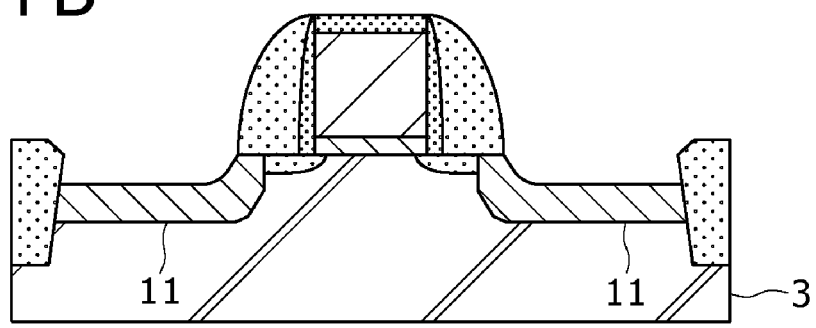
Figure 4C:
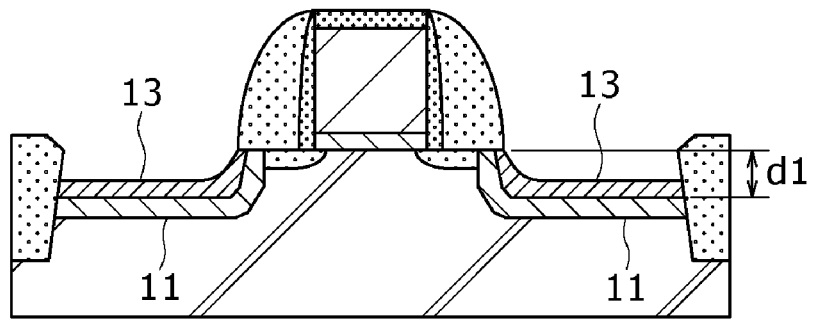

Method for Production of the Semiconductor Device According to the Second Embodiment FIGS. 4A to 4C are sectional views showing the steps of the method for producing the semiconductor device 1-2 according to the second embodiment which has been explained above with reference to FIG. 3. The following describes the production method according to the second embodiment with reference to this figure and the sectional views used for description of the production method according to the first embodiment.

The first step is to perform the same steps as explained above with reference to FIGS. 2A to 2G in the first embodiment.

The result of the first step is shown in FIG. 4A. The semiconductor substrate 3 of single crystal silicon is separated by the isolation 31 formed in the surface thereof. The dummy gate structure A is formed, which is composed of the hard mask layer 39, dummy gate electrode film 37, and dummy gate insulating film 35, formed by pattern etching into the shape of the gate electrode. On the sides of the dummy gate structure A are formed the side wall 9, which is composed of the insulating first side wall 9-1 and the outer second side wall 9-2. Under the side wall 9 is formed the source-drain diffusion layer 11 having the extension 11e.

The next step shown in FIG. 4B is to dig by recess etching the exposed surface of the semiconductor substrate 3 or the exposed surface of the source-drain diffusion layer 11.

The next step shown in FIG. 4C is to form the silicide film 13 (as the stress applying layer) of such metal as cobalt (Co), nickel (Ni), and platinum (Pt) on the source-drain diffusion layer 11 by salicide process. This silicide film 13 reduces the contact resistance of the source-drain diffusion layer 11. As the silicide forming process proceeds, the silicide film (stress applying layer) 13 grows also in the depthwise direction in the surface of the source-drain diffusion layer 11 or in the surface of the semiconductor substrate 3 of single crystal silicon. Therefore, it is important that the silicide film (stress applying layer) 13 should be grown sufficiently to the depth of d1 from the surface of the semiconductor substrate 3 within the depth of the source-drain diffusion layer 11.

The foregoing step is followed by the steps which have been explained above with reference to FIGS. 2I to 2P in the first embodiment.

That is, these steps are to form the interlayer insulating film 15, polish by CMP the surface thereof until the dummy gate electrode 37a of the dummy gate structure A exposes itself, and remove the dummy gate structure A, thereby forming the groove pattern 17 and causing the semiconductor substrate 3 to expose itself at the bottom of the groove pattern 17. This groove pattern 17 has its side wall defined by the side wall 9 (9-1 and 9-2).

The next step is to dig the exposed surface of the semiconductor substrate 3 at the bottom of the groove pattern 17, perform recess etching to form the recess 3a in the semiconductor substrate 3, and dig the groove pattern 17 at the position away from the silicide film (stress applying layer) 13. Assuming that the depth of the silicide film (stress applying layer) 13 from the surface of the semiconductor substrate 3 is d1 and the depth of the recess 3a (or the channel depth) is d2, the relation of [d2]<[d1] should hold. However, in the second embodiment, it is desirable to perform recess etching in such a way that the bottom of the recess 3a is positioned within the thickness of the silicide film (stress applying layer) 13 or between the surface of the silicide film (stress applying layer) 13 and the position (back side) of the depth d1.

Then, the gate insulating film 5 is formed in such a way as to cover the inside wall of the groove pattern 17 which has been formed by digging the surface of the semiconductor substrate 3. Further, the gate insulating film 5 is formed and the gate electrode material film 7a is formed, and they are polished by CMP so as to form the gate electrode 7, with the gate electrode material film 7a remaining and the gate insulating film 5 interposed in the groove pattern 17. After that, the upper layer insulating film 19, the connecting hole 21, and the wiring 23 are formed.

In this way there is obtained the semiconductor device 1-2 which is constructed of the gate electrode 7, which has been formed in the recess 3a dug in the surface of the semiconductor substrate 3, with the gate insulating film 5 interposed, and the silicide film (stress applying layer) 13 which is formed deep from the surface of the semiconductor substrate 3 in such a way as to cover the source-drain diffusion layer 11 adjacent to both sides of the gate electrode 7, as explained above with reference to FIG. 3.

The production method according to the second embodiment is the same as that according to the first embodiment in that the dummy gate structure A is removed, with the silicide film (stress applying layer) 13 formed. Therefore, the stress that is applied to that part of the semiconductor substrate 3 which is under the dummy gate structure A from the silicide film (stress applying layer) 13 is not weakened by the counteraction from the dummy gate electrode 37a. As a result, the stress from the silicide film (stress applying layer) 13 is effectively applied to the channel part ch.

As in the first embodiment, after the dummy gate structure A has been removed, the semiconductor substrate 3 at the bottom of the groove pattern 17 is dug down further, so that the channel part ch is positioned deep from the surface of the semiconductor substrate 3. As a result, the channel part ch concentratedly receives the stress which is applied to that part of the semiconductor substrate 3 within the silicide film (stress applying layer) 13 in the depthwise direction of the silicide film (stress applying layer) 13. Therefore, the resulting semiconductor device 1-2 is constructed such that the stress from the silicide film (stress applying layer) 13 is effectively and concentratedly applied to the channel part ch.

Structure of the Semiconductor Device According to the Third Embodiment

Figure 5:
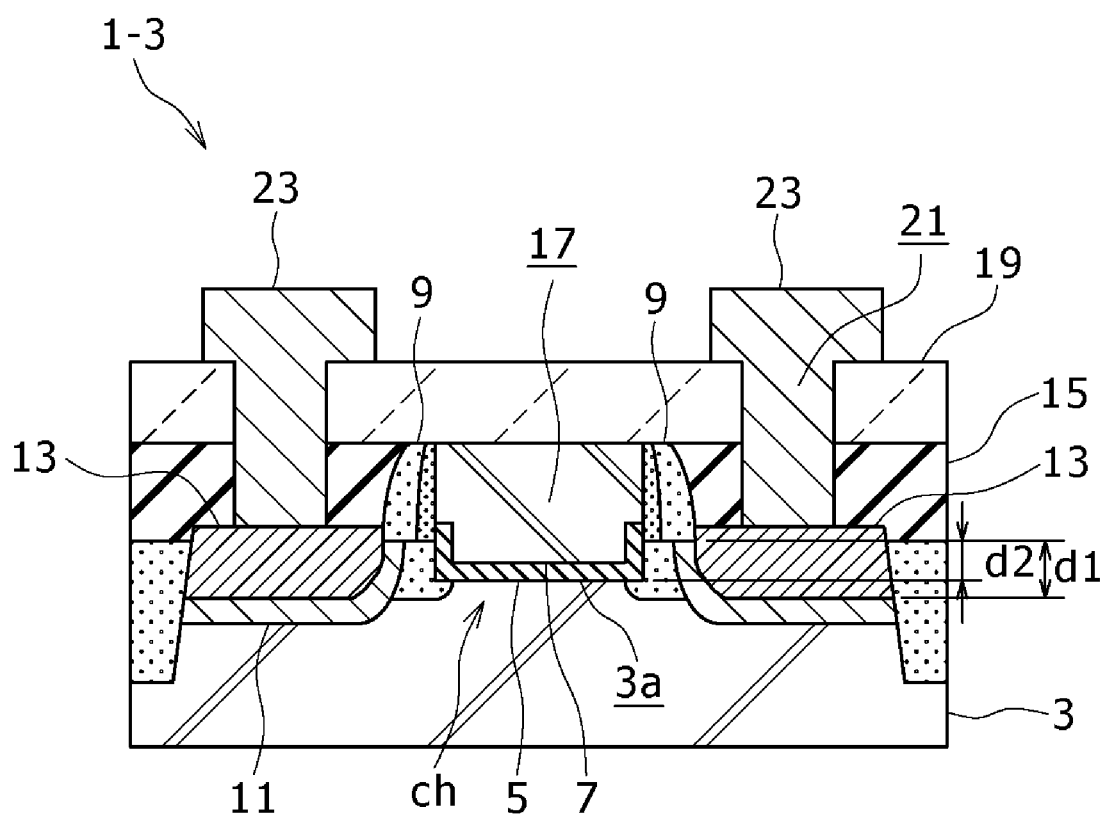
FIG. 5 is a sectional view showing a semiconductor device according to a third embodiment.

FIG. 5 is a sectional view showing important parts of the semiconductor device 1-3 according to the third embodiment of the present invention. The semiconductor device 1-3 shown in this figure is a semiconductor device of field-effect transistor type. It differs from that according to the first embodiment explained above with reference to FIG. 1 in that the gate insulating film 5 does not entirely covers the inner wall of the groove pattern 17 but permits the upper part of the inner wall to expose itself. Except for this, its structure is identical with the structure according to the first embodiment.

As in the first embodiment, the semiconductor device is formed on the semiconductor substrate 3 of single crystal silicon. The semiconductor substrate 3 has the recess 3a which is formed by digging the surface thereof. On the semiconductor substrate 3 is formed the gate electrode 7 which fills the recess 3a, with the gate insulating film 5 therebetween. On both sides of the gate electrode 7 are formed the insulating side walls 9. That surface of the semiconductor substrate 3, which is adjacent to both sides of the gate electrode 7 having the side walls 9, has the source-drain diffusion layer 11. The source-drain diffusion layer 11 has its surface covered with the silicide film 13.

In the third embodiment, the silicide film 13 also functions as the stress applying layer to apply stress to the channel part ch in that part of the semiconductor substrate 3 which is under the gate electrode 7. The silicide film (stress applying layer) 13 is formed by the steps to be detailed later in the section of production method. It is formed by converting into silicide the exposed surface of the semiconductor substrate 3 on which the source-drain diffusion layer 11 has been formed. It has a sufficient depth d1 from the surface of the semiconductor substrate 3 within the depth of the source-drain diffusion layer 11.

Assuming that d1 denotes the depth of the silicide film (stress applying layer) 13 from the surface of the semiconductor substrate 3 and d2 denotes the depth of the recess 3a in which the gate insulating film 5 and the gate electrode 7 are buried (or the depth of the channel part ch), then the relation of [d2]<[d1] should hold as in the first embodiment. The optimal depth d2 of the channel part ch should be experimentally established so that a maximum stress is applied to the channel part ch as in the first embodiment.

As in the first embodiment, it is desirable that the channel part ch should be positioned within the thickness of the silicide film (stress applying layer) 13 or between the surface of the silicide film (stress applying layer) 13 and the position (back side) of the depth d1.

In this case, too, as in the first embodiment, the silicide film 13 is formed from a silicide of cobalt (Co), nickel (Ni), or platinum (Pt). The silicide film 13 of such composition functions as the stress applying layer that applies tensile stress to the semiconductor substrate 3. It can be favorably used for the field-effect transistor of n-channel type. On the other hand, if the silicide film 13 is one which applies a compressive stress, the semiconductor device 1-3 having it is favorably used for the field-effect transistor of p-channel type.

As in the first embodiment, the gate insulating film 5 and the gate electrode 7 are of damascene gate structure, and the gate electrode 7 has the insulating side walls 9. In this structure, the interlayer insulating film 15, which covers the semiconductor substrate 3 and the silicide film (stress applying layer) 13, has the groove pattern 17 whose side walls are defined by the side walls 9. The bottom of the groove pattern 17 is at the bottom of the recess 3a which has been formed by digging the semiconductor substrate 3. Then, in the third embodiment, the gate insulating film 5 is so formed as to cover the inner wall of the recess 3a, which is the lower part of the groove pattern 17, and permit the upper part of the inner wall of the groove pattern 17 to expose itself, and the gate electrode 7 is so formed as to fill the groove pattern 17, with the gate insulating film 5 interposed therebetween.

Incidentally, the semiconductor device 1-3 may be one which is optionally covered with the upper layer insulating film 19. In this case, the structure may be modified such that the connecting hole 21 reaching the silicide film (stress applying layer) 13 is formed in the upper layer insulating film 19 and the interlayer insulating film 15 and the wiring 23 is formed which is connected to the source-drain diffusion layer 11 through the silicide film (stress applying layer) 13 at the bottom of the connecting hole 21.

As in the first embodiment, the gate insulating film 5 should preferably be formed from a high dielectric (High-K) material in order to reduce the effective film thickness while maintaining the physical film thickness. The high dielectric material is the same one as used in the first embodiment.

The gate electrode 7 is identical in structure and material with that in the first embodiment.

In the semiconductor device 1-3 constructed as mentioned above, too, the channel part ch, which is adjacent to the interface with the gate insulating film 5 in the semiconductor substrate 3, is formed deep from the surface of the semiconductor substrate 3 within the thickness of the silicide film (stress applying layer) 13.

The consequence of this structure is that stress applied to that part of the semiconductor substrate 3 which corresponds to the thickness of the silicide film (stress applying layer) 13 is concentrated to the channel part ch positioned half way in the depthwise direction of the silicide film (stress applying layer) 13. Thus the foregoing structure permits stress to be applied to the channel part ch from the silicide film (stress applying layer) 13 more effectively than the structure in related art in which the channel part is at approximately the same height as the surface of the semiconductor substrate 3.

As a result, the carrier mobility is improved regardless of the concentration of the material constituting the silicide film (stress applying layer) 13. And this contributes to the improved performance of the semiconductor device 1-3.

In addition, the semiconductor device according to the third embodiment is constructed such that the gate insulating film 5 is formed only on the inner wall of the recess 3a constituting the lower part of the groove pattern 17 in such a way that the upper part of the inner wall of the groove pattern 17 exposes itself. Therefore, the gate insulating film 5 formed from a high-dielectric material does not exist between the gate electrode 7 and the wiring 23, and this produces the effect of preventing the device performance from deteriorating due to parasitic capacity between the gate electrode 7 and the wiring 23.

Method for Production of the Semiconductor Device According to the Third Embodiment FIGS. 6A to 6M are sectional views showing the steps of the method for producing the semiconductor device 1-3 according to the third embodiment which has been explained above with reference to FIG. 5. The following describes the production method according to the third embodiment with reference to these figures.

Figure 6A:
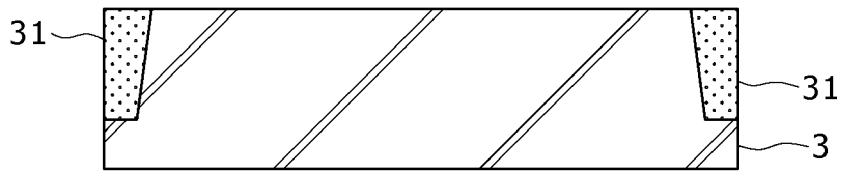
FIGS. 6A to 6M are sectional views showing the production method according to the third embodiment.

The first step shown in FIG. 6A is to form the isolation in the surface layer of the semiconductor substrate, form the protective film (not shown), perform ion implantation through it for an impurity that adjusts the threshold value, and remove the protective film after ion implantation, in the same way as in the first embodiment.

Figure 6B:
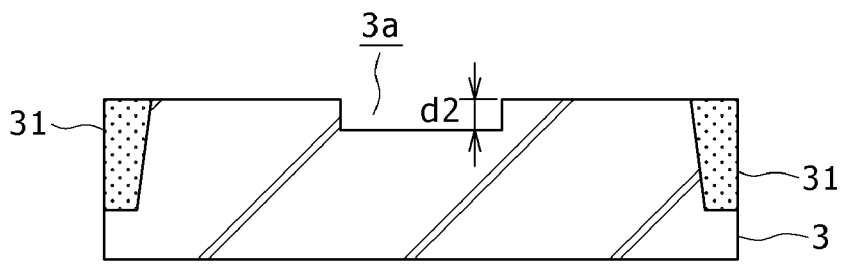

The next step shown in FIG. 6B is to form the groove-like recess 3a, which coincides with the gate electrode to be formed later, in the space held between the isolations 31 in the semiconductor substrate 3. This recess 3a is formed by recess etching on the semiconductor substrate 3 through a mask which is a resist pattern formed by optical lithography or electron beam lithography. Incidentally, the channel depth, that is, the depth of the recess 3a, is identical with the channel depth d2 explained in the first embodiment because the surface layer of the recess 3a is the channel part. This channel depth d2 is the same as that in the first embodiment and the relation [d2]<[d1] should hold for the depth d1 of the silicide film (stress applying layer) to be formed later.

Figure 6C:
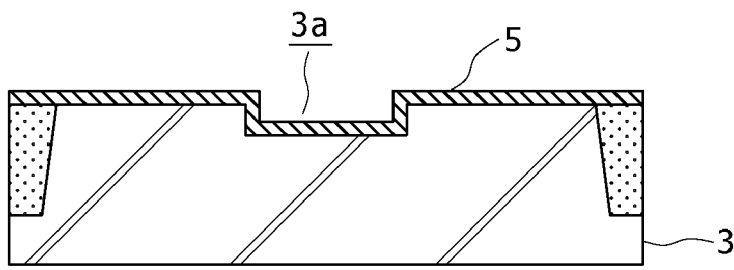

The next step shown in FIG. 6C is to form the gate insulating film 5 from a high dielectric material (mentioned above) by CVD or ALD process in such a way as to cover the inner wall of the recess 3a which has been formed by digging the surface of the semiconductor substrate 3. Incidentally, although the gate insulating film 5 is previously formed from a high dielectric material in this step, it may be replaced by a dummy oxide film.

Figure 6D:
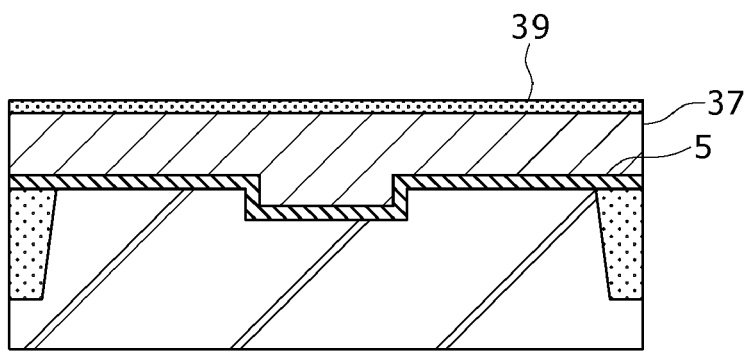

The next step shown in FIG. 6D is to cover the gate insulating film 5 sequentially with a dummy gate electrode film 37 of polysilicon or amorphous silicon and a hard mask layer 39 of silicon nitride.

Figure 6E:
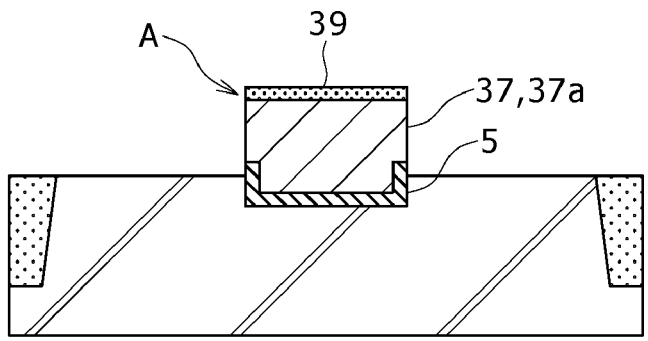

The next step shown in FIG. 6E is to perform etching on the hard mask layer 39 through a resist pattern as a mask (not shown) in order to pattern the hard mask layer 39. Etching is further performed through the patterned hard mask layer 39 on the dummy gate electrode film 37 for its patterning to form the dummy gate electrode 37a. The patterning of the dummy gate electrode film 37 is carried out in such a way that the gate insulating film 5 of high dielectric material functions as the stopper so that etching damage does not enter the surface of the semiconductor substrate 3 on both sides of the dummy gate structure A. This etching is accomplished by dry etching with $HBr/O_2$ as the etchant gas.

The foregoing dry etching is followed by etching on the gate insulating film 5 in such a way that the gate insulating film 5 remains only under the dummy gate structure A.

In the illustrated example, the dummy gate structure A coincides with the recess 3a. However, this embodiment is not limited to this; the pattern may be displaced so long as the dummy gate structure A overlaps the recess 3a.

Figure 6F:
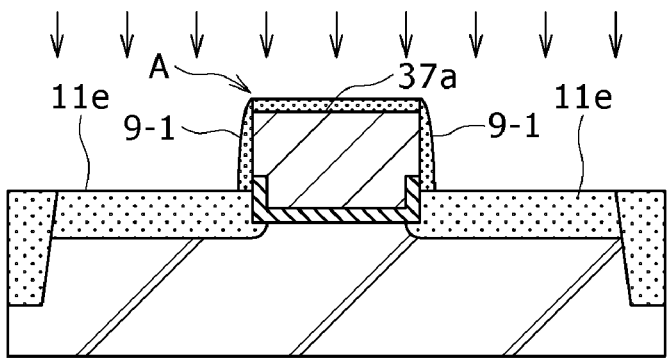

The next step shown in FIG. 6F is to form the insulating first side wall 9-1 on the lateral wall of the dummy gate structure A. The ion implantation is performed to introduce an impurity (which forms the extension 11e of the source-drain diffusion layer) into the surface layer of the semiconductor substrate 3. Incidentally, this ion implantation is performed in the same way as the first embodiment to introduce different impurities for pMOS region and nMOS region. This step is optional to be carried out according to need.

Figure 6G:
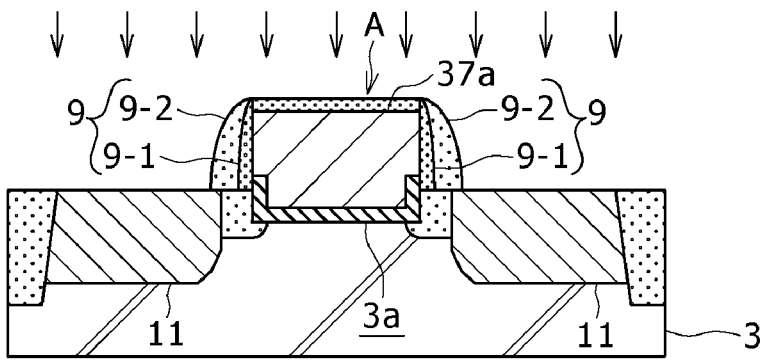

The next step shown in FIG. 6G is to form the insulating second side walls 9-2 outside the first side walls 9-1. Incidentally, the first side walls 9-1 and the second side walls 9-2 will be collectively referred to as the side walls 9, hereinafter.

Then, ion implantation of impurity is performed to form the source-drain diffusion layer 11 and heat treatment is carried out to activate the impurity. Incidentally, in the case where the pattern of the dummy gate structure A is displaced from the pattern of the recess 3a and the bottom of the recess 3a exposes itself from the dummy gate structure A, it is desirable that the exposed part of the recess 3a be completely covered with the second side wall 9-2.

Figure 6H:
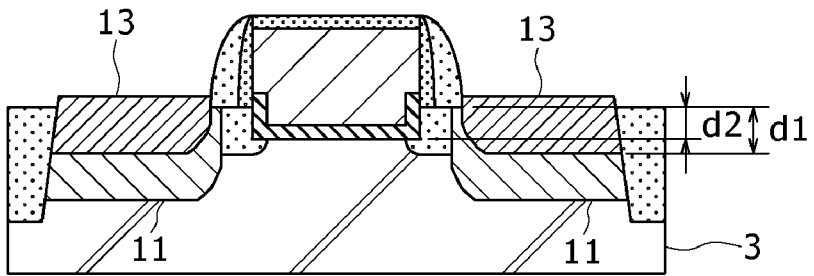

The next step shown in FIG. 6H is to form the metal silicide film 13 as the stress applying layer on the surface of the source-drain diffusion layer 11 outside the side wall 9 by salicide process. The metal for the metal silicide film 13 is selected from cobalt (Co), nickel (Ni), and platinum (Pt). This silicide film 13 reduces the contact resistance of the source-drain diffusion layer 11. As the silicide forming process proceeds, it causes the silicide film (stress applying layer) 13 to grow in the depthwise direction in the surface of the source-drain diffusion layer 11 or the surface of the semiconductor substrate 3 of single crystal silicon. Therefore, it is important that the silicide film (stress applying layer) 13 should be sufficiently grown down to the depth (d1) from the surface of the semiconductor substrate 3 within the depth of the source-drain diffusion layer 11 and the recess 3a has the depth d2 such that [d2]<[d1].

Figure 6I:
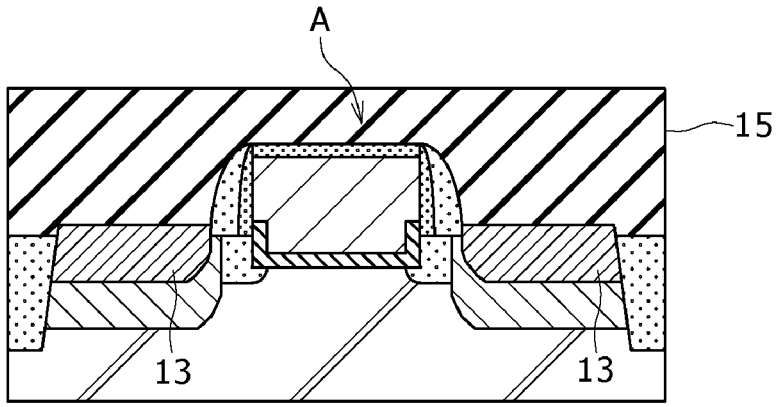

The next step shown in FIG. 6I is to form the interlayer insulating film 15 of silicon oxide in such a way as to bury therein the dummy gate structure A and the silicide film (stress applying layer) 13.

Figure 6J:
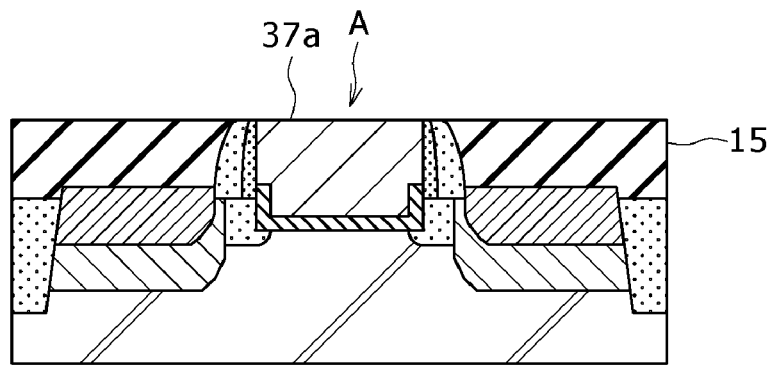

The next step shown in FIG. 6J is to polish the surface of the interlayer insulating film 15 by CMP process until the dummy gate electrode 37a of the dummy gate structure A exposes itself.

Figure 6K:
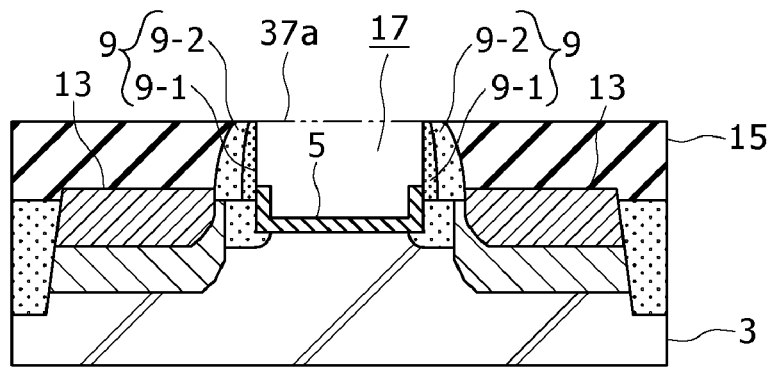

The next step shown in FIG. 6K is to remove by dry etching the dummy gate electrode 37a of polysilicon or amorphous silicon, with the gate insulating film 5 remaining. In this way, the groove pattern 17 is formed after removal of the dummy gate structure A in the interlayer insulating film 15 that covers the semiconductor substrate 3 and the silicide film (stress applying layer) 13. The bottom of groove pattern 17 is left covered with the gate insulating film 5. This groove pattern 17 is formed again in the recess 3a. This groove pattern 17 has its side wall defined by the side wall 9 (9-1 and 9-2). Incidentally, the gate insulating film 5 of high dielectric material is previously formed in this embodiment, however, if the dummy gate insulating film exists, it is also removed in this step.

Figure 6L:
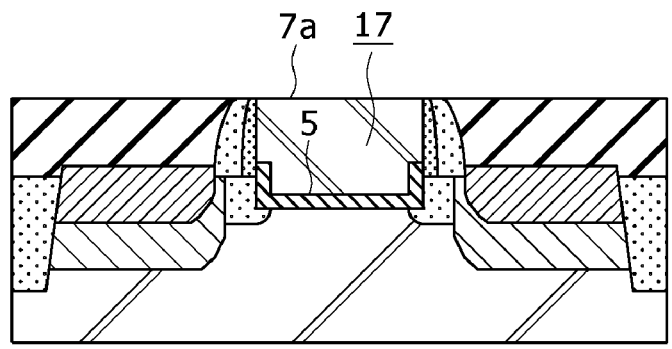

The next step shown in FIG. 6L is to form the gate electrode 7, in such a way as to fill the inside of the groove pattern 17. At this time, the gate electrode material film is formed, with the gate insulating film 5 interposed, in such a way that the inside of the groove pattern 17 is filled. Here, the gate electrode material film is formed from a metal layer for the metal gate by CVD, PVD, or ALD process. The gate electrode material film 7 may be of single layer structure or multilayer structure. It may be formed from any material mentioned in the description of the first embodiment about the structure of the device. The next step is to polish by CMP the gate electrode material film until the interlayer insulating film 15 exposes itself. In this way the gate electrode 7 is formed in the groove pattern 17, with the gate electrode material film remaining which is in contact with the gate insulating film 5. Incidentally, in the case where the dummy gate insulating film has been removed, the gate insulating film should be formed before the gate electrode material film is formed.

Figure 6M:
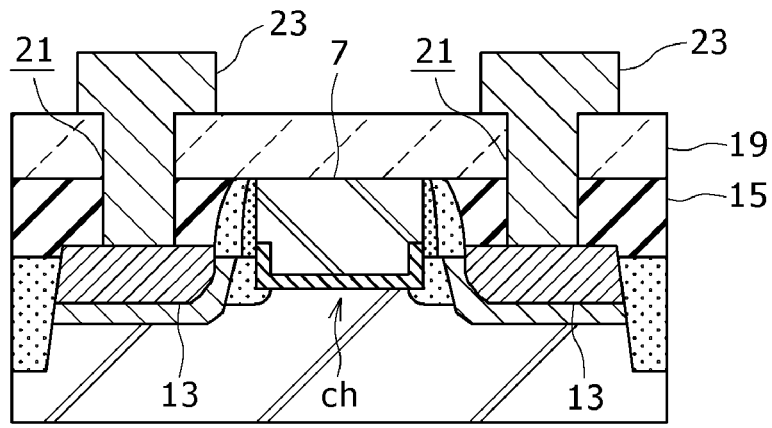

The step just mentioned above may be followed by an optional step of forming the upper layer insulating film 19 of silicon oxide in such a way as to cover the interlayer insulating film 15 and the gate electrode 7, as shown in FIG. 6M. Then, the connecting hole 21, which reaches the silicide film (stress applying layer) 13, is formed in the upper layer insulating film 19 and the interlayer insulating film 15. Further, the plug that fills the connecting hole 21 and the wiring 23 for its connection are formed.

The forgoing steps yield the semiconductor device 1-3 which has been described above with reference to FIG. 5. It has the gate electrode 7 which is formed in the recess 3a dug in the surface of the semiconductor substrate 3, with the gate insulating film 5 surrounding it. It also has the silicide film (stress applying layer) 13 which is formed deep from the surface of the semiconductor substrate 3 in such a way as to cover the surface of the source-drain diffusion layer 11 adjacent to both sides of the gate electrode 7.

The above-mentioned production method also offers the following advantages. As explained with reference to FIG. 6K, the dummy gate electrode 37a is removed while the silicide film (stress applying layer) 13 remains. Therefore, the stress that is applied to that part of the semiconductor substrate 3 which is under the dummy gate structure A from the silicide film (stress applying layer) 13 is not weakened by the counteraction from the dummy gate electrode 37a. As a result, the stress from the silicide film (stress applying layer) 13 is effectively applied to the channel part ch.

The semiconductor substrate 3 at the bottom of the groove pattern 17 is dug down further to form the recess 3a, so that the channel part ch is positioned deep from the surface of the semiconductor substrate 3. As a result, the channel part ch concentratedly receives the stress which is applied to that part of the semiconductor substrate 3 within the silicide film (stress applying layer) 13 in the depthwise direction of the silicide film (stress applying layer) 13. Therefore, as in the firs embodiment, the resulting semiconductor device 1-3 is constructed such that the stress from the silicide film (stress applying layer) 13 is effectively and concentratedly applied to the channel part ch.

Method for Production of the Semiconductor Device According to the Third Embodiment Modified Example FIGS. 7A to 7M are sectional views showing the steps of the method for producing the semiconductor device 1-3 according to a modified example of the third embodiment which has been explained above with reference to FIG. 5. The following describes a modified example of the production method according to the third embodiment with reference to these figures.

Figure 7A:
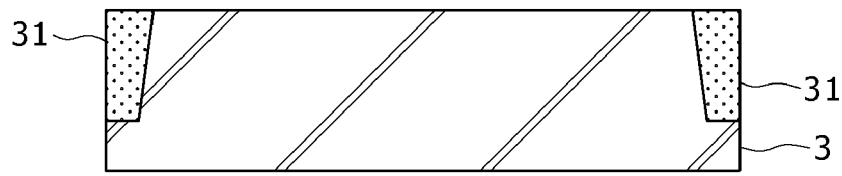
FIGS. 7A to 7M are sectional views showing a modified example of the production method according to the third embodiment.
Figure 7B:
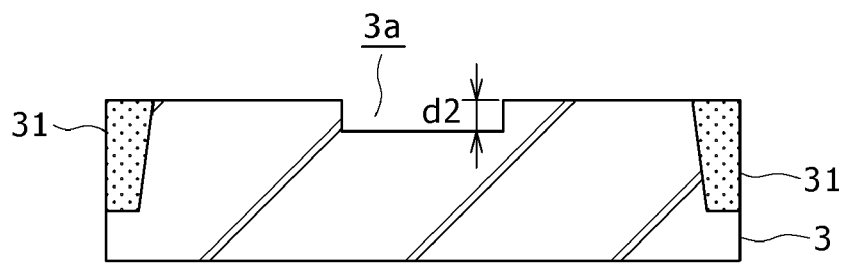

The steps shown in FIGS. 7A and 7B are the same as those in the third embodiment.

The first step shown in FIG. 7A is to form the isolation in the surface layer of the semiconductor substrate, form the protective film (not shown), perform ion implantation through it for an impurity that adjusts the threshold value, and remove the protective film after ion implantation, in the same way as in the first embodiment.

The next step shown in FIG. 7B is to form the groove-like recess 3a, which coincides with the gate electrode to be formed later, in the space held between the isolations 31 in the semiconductor substrate 3. This recess 3a is formed by recess etching on the semiconductor substrate 3 through a mask which is a resist pattern formed by optical lithography or electron beam lithography. Incidentally, the channel depth, that is, the depth of the recess 3a, is identical with the channel depth d2 explained in the first embodiment because the surface layer of the recess 3a is the channel part. This channel depth d2 is the same as that in the first embodiment and the relation [d2]<[d1] should hold for the depth d1 of the silicide film (stress applying layer) to be formed later.

Figure 7C:
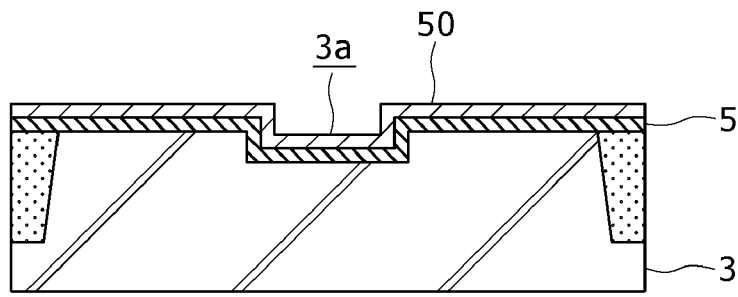

The next step shown in FIG. 7C is to form the gate insulating film 5 from a high dielectric material (mentioned above) by CVD or ALD process in such a way as to cover the inner wall of the recess 3a which has been formed by digging the surface of the semiconductor substrate 3. In this modified example, the gate insulating film 5 is covered with a cap film 50 by CVD, PVD, or ALD process. The cap film 50 is intended to protect the gate insulating film 5 in the subsequent steps. The cap film 50 is a titanium nitride (TiN) film, about 1 to 10 nm thick.

Figure 7D:
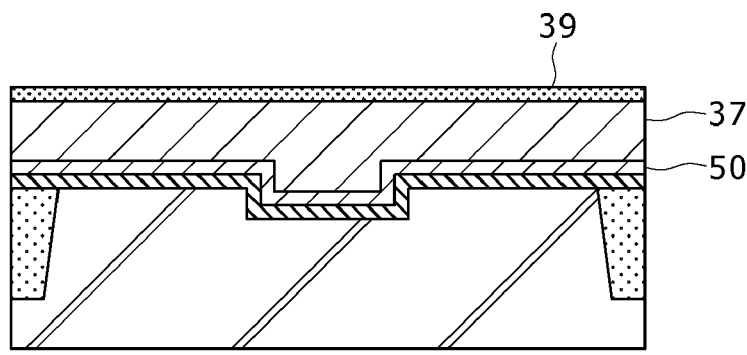

The next step shown in FIG. 7D is to cover the cap film 50 sequentially with a dummy gate electrode film 37 of polysilicon or amorphous silicon and a hard mask layer 39 of silicon nitride.

Figure 7E:
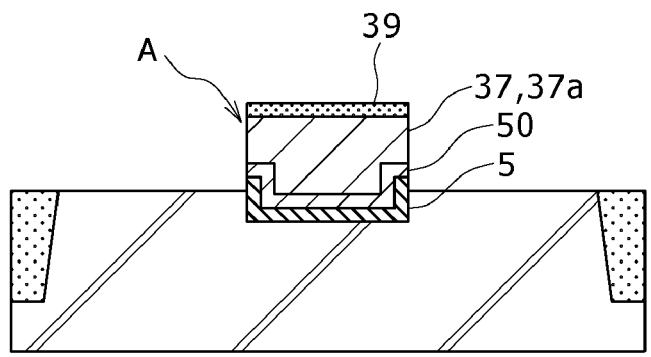

The next step shown in FIG. 7E is to perform etching on the hard mask layer 39 through a resist pattern as a mask (not shown) in order to patter the hard mask layer 39. Etching is further performed through the patterned hard mask layer 39 on the dummy gate electrode film 37 for its patterning to form the dummy gate electrode 37a. The etching of the dummy gate electrode 37 is followed by the etching of the cap film 50 and the gate insulating film 5 in such a way that the gate insulating film 5 remains only under the dummy gate structure A.

The subsequent steps shown in FIGS. 7F to 7J are identical with those shown in FIG. 6F to 6J which have been explained in the third embodiment.

Figure 7F:
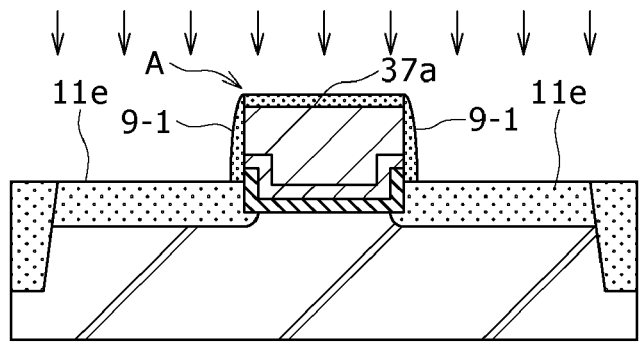

The next step shown in FIG. 7F is to form the insulating first side wall 9-1 on the lateral wall of the dummy gate structure A. The ion implantation is performed to introduce an impurity (which forms the extension 11e of the source-drain diffusion layer) into the surface layer of the semiconductor substrate 3. Incidentally, this ion implantation is performed in the same way as the first embodiment to introduce different impurities for pMOS region and nMOS region. This step is optional to be carried out according to need.

Figure 7G:
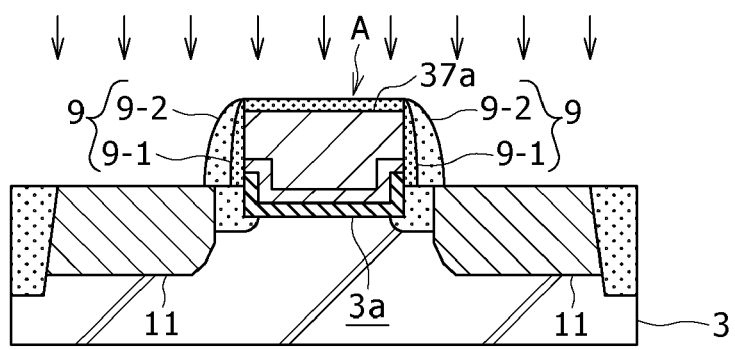

The next step shown in FIG. 7G is to form the insulating second side walls 9-2 outside the first side walls 9-1. Incidentally, the first side walls 9-1 and the second side walls 9-2 will be collectively referred to as the side walls 9, hereinafter.

Then, ion implantation of impurity is performed to form the source-drain diffusion layer 11 and heat treatment is carried out to activate the impurity. Incidentally, in the case where the pattern of the dummy gate structure A is displaced from the pattern of the recess 3a and the bottom of the recess 3a exposes itself from the dummy gate structure A, it is desirable that the exposed part of the recess 3a be completely covered with the second side wall 9-2.

Figure 7H:
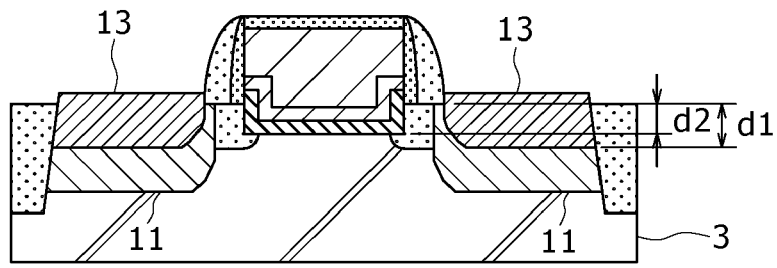

The next step shown in FIG. 7H is to form the metal silicide film 13 as the stress applying layer on the surface of the source-drain diffusion layer 11 by salicide process. The metal for the metal silicide film 13 is selected from cobalt (Co), nickel (Ni), and platinum (Pt). This silicide film 13 reduces the contact resistance of the source-drain diffusion layer 11. As the silicide forming process proceeds, it causes the silicide film (stress applying layer) 13 to grow in the depthwise direction in the surface of the source-drain diffusion layer 11 or the surface of the semiconductor substrate 3 of single crystal silicon. Therefore, it is important that the silicide film (stress applying layer) 13 should be sufficiently grown down to the depth (d1) from the surface of the semiconductor substrate 3 within the depth of the source-drain diffusion layer 11 and the recess 3a has the depth d2 such that [d2]<[d1].

Figure 7I:
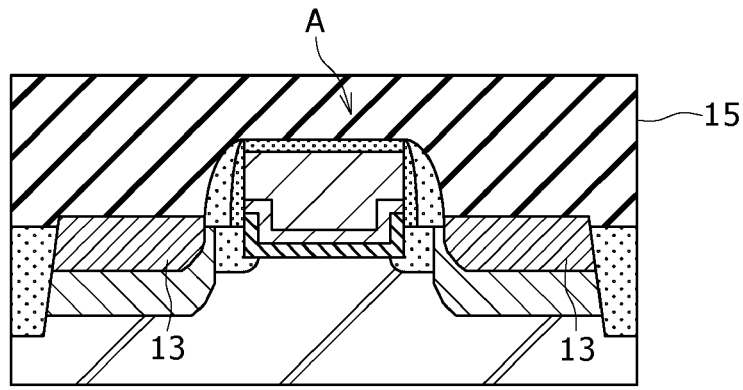

The next step shown in FIG. 7I is to form the interlayer insulating film 15 of silicon oxide in such a way as to bury therein the dummy gate structure A and the silicide film (stress applying layer) 13.

Figure 7J:
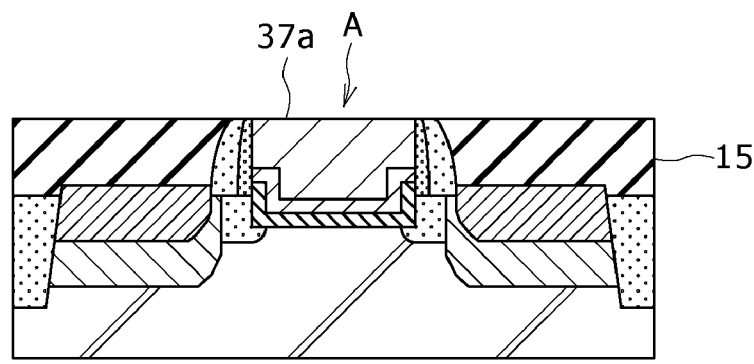

The next step shown in FIG. 7J is to polish the surface of the interlayer insulating film 15 by CMP process until the dummy gate electrode 37a of the dummy gate structure A exposes itself.

Figure 7K:
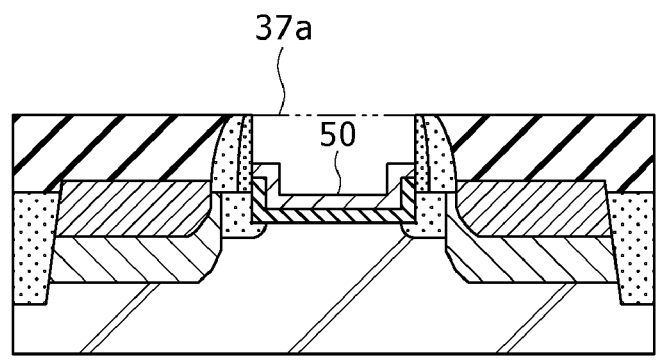

The next step shown in FIG. 7K is to remove the dummy gate electrode 37a of polysilicon or amorphous silicon by dry etching which employs the cap film 50 as the etching stopper. In this way it is possible to protect the gate insulating film 5 of high dielectric material from damage.

Figure 7L:
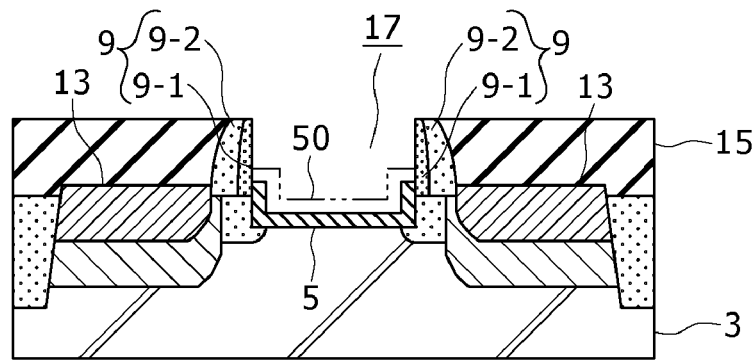

The next step shown in FIG. 7L is to selectively remove the cap film 50 by wet etching or dry etching which causes little etching damage to the underlying layer. Thus, this step forms the groove pattern 17 in the interlayer insulating film 15 that covers the semiconductor substrate 3 and the silicide film (stress applying layer) 13. The bottom of the groove pattern 17 is left covered with the gate insulating film 5, and this groove pattern 17 is formed in duplicate in the recess 3a. Also, this groove pattern 17 is defined by the lateral wall of the side wall 9 (9-1, 9-2).

Figure 7M:
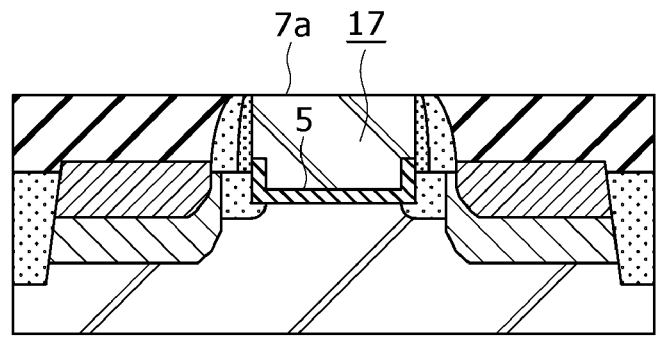

The next step shown in FIG. 7M is carried out in the same way as explained with reference to FIGS. 6L and 6M in the third embodiment.

The next step shown in FIG. 7M is to form the gate electrode 7, in such a way as to fill the inside of the groove pattern 17. At this time, the gate electrode material film is formed, with the gate insulating film 5 interposed, in such a way that the inside of the groove pattern 17 is filled. Here, the gate electrode material film is formed from a metal for the metal gate by CVD, PVD, or ALD process. The gate electrode material film 7 may be of single layer structure or multilayer structure. It may be formed from any material mentioned in the first embodiment. The next step is to polish by CMP the gate electrode material film until the interlayer insulating film 15 exposes itself. In this way the gate electrode 7 is formed in the groove pattern 17, with the gate electrode material film remaining which is in contact with the gate insulating film 5.

The step just mentioned above may be followed by an optional step of forming the upper layer insulating film 19 of silicon oxide in such a way as to cover the interlayer insulating film 15 and the gate electrode 7, as shown in FIG. 5. Then, the connecting hole 21, which reaches the silicide film (stress applying layer) 13, is formed in the upper layer insulating film 19 and the interlayer insulating film 15. Further, the plug that fills the connecting hole 21 and the wiring 23 for its connection are formed.

The forgoing steps yield the semiconductor device 1-3 which has been described above with reference to FIG. 5. It has the gate electrode 7 which is formed in the recess 3a dug in the surface of the semiconductor substrate 3, with the gate insulating film 5 surrounding it. It also has the silicide film (stress applying layer) 13 which is formed deep from the surface of the semiconductor substrate 3 in such a way as to cover the surface of the source-drain diffusion layer 11 adjacent to both sides of the gate electrode 7.

The above-mentioned production method also offers the following advantages. As explained with reference to FIG. 7K, the dummy gate electrode 37a is removed while the silicide film (stress applying layer) 13 remains. Therefore, the stress that is applied to that part of the semiconductor substrate 3 which is under the dummy gate electrode 37a from the silicide film (stress applying layer) 13 is not weakened by the counteraction from the dummy gate electrode 37a. As a result, the stress from the silicide film (stress applying layer) 13 is effectively applied to the channel part ch.

The semiconductor substrate 3 at the bottom of the groove pattern 17 is dug down further to form the recess 3a, so that the channel part ch is positioned deep from the surface of the semiconductor substrate 3. As a result, the channel part ch concentratedly receives the stress which is applied to that part of the semiconductor substrate 3 within the silicide film (stress applying layer) 13 in the depthwise direction of the silicide film (stress applying layer) 13. Therefore, the resulting semiconductor device 1-3 is constructed such that the stress from the silicide film (stress applying layer) 13 is effectively and concentratedly applied to the channel part ch as in the first embodiment.

According to the third embodiment in its modified form, the production method includes the steps of forming the cap film 50 on the gate insulating film 5 and removing the dummy gate electrode 37a by using it as the etching stopper. Therefore, even in the case where the gate insulating film 5 is previously formed, it is possible to protect the gate insulating film 5 from etching damage when the dummy gate electrode 37a is removed, and this permits the gate insulating film 5 to maintain its quality.

Incidentally, according to the third embodiment in its modified form, the production method includes the step of removing the cap film 50. However, the cap film 50 may remain as a portion of the gate electrode. In this case, the cap film 50 may be left as the work function regulating layer mentioned in the section of device structure. It may be formed from any material adequately selected.

Structure of the Semiconductor Device According to the Fourth Embodiment

Figure 8:
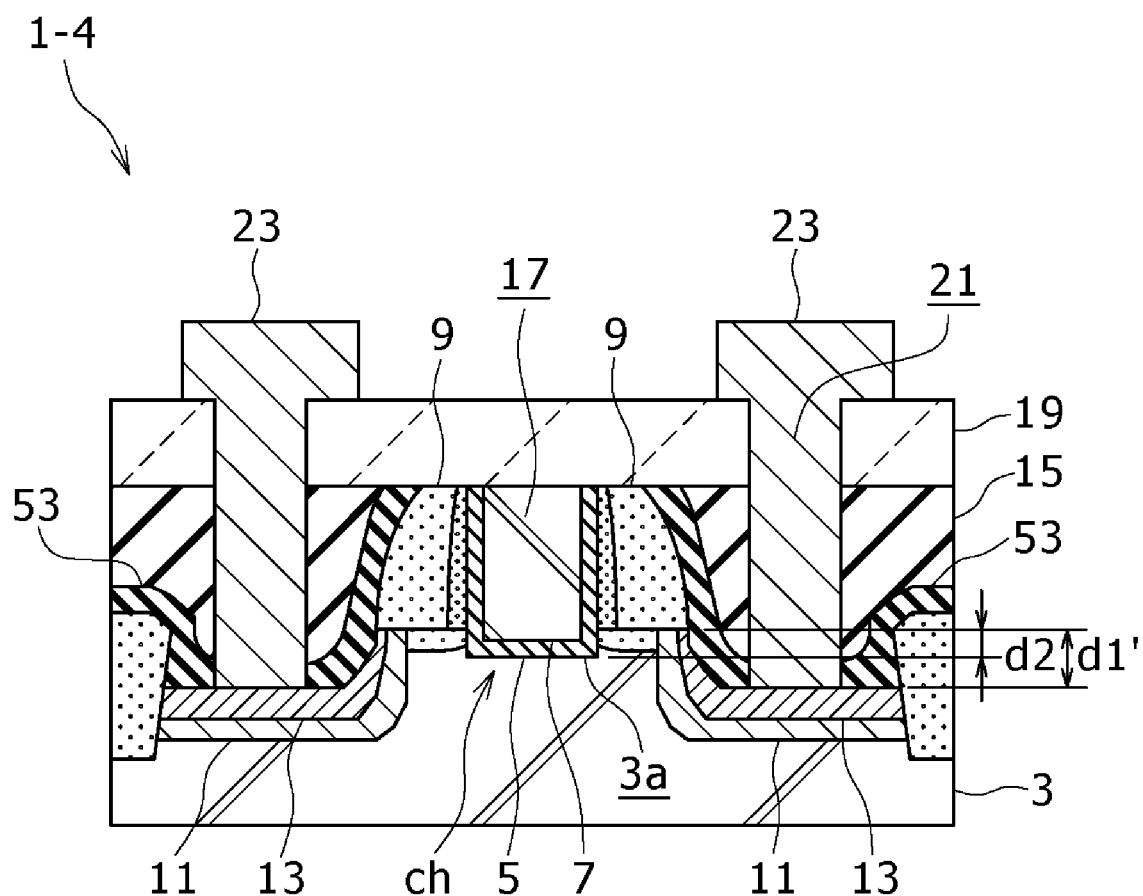
FIG. 8 is a sectional view showing a semiconductor device according to a fourth embodiment.

FIG. 8 is a sectional view showing important parts of the semiconductor device 1-4 according to the fourth embodiment of the present invention. The semiconductor device 1-4 shown in this figure is a semiconductor device of field-effect transistor type. It differs from that according to the first embodiment explained above with reference to FIG. 1 in that that part of the surface of the semiconductor substrate 3 in which the source-drain diffusion layer 11 and the silicide film film 13 are formed is dug by recess etching. It also differs in having the stress liner film (stress applying layer) 53 formed as the stress applying layer. Except for these differences, it is identical with that according to the first embodiment.

As in the first embodiment, the semiconductor device is formed on the semiconductor substrate 3 of single crystal silicon. The semiconductor substrate 3 has the recess 3a which is formed by digging the surface thereof. On the semiconductor substrate 3 is formed the gate electrode 7 which fills the recess 3a, with the gate insulating film 5 therebetween. On both sides of the gate electrode 7 are formed the insulating side walls 9. According to the fourth embodiment, that surface of the semiconductor substrate 3, which is adjacent to both sides of the gate electrode 7 having the side walls 9, is dug by recess etching, and the source-drain diffusion layer 11 is formed on the dug surface side. The source-drain diffusion layer 11 has its surface covered with the silicide film 13. Moreover, according to the fourth embodiment, the silicide film 13 and the flank of the side wall 9 are continuously covered with the stress liner film 53.

The stress liner film 53 functions as the stress applying layer that applies stress to the channel part ch of the semiconductor substrate 3 under the gate electrode 7. It is formed from silicon nitride, for example. Any material will be selected that applies tensile stress to the semiconductor substrate 3 in the nMOS region or that applies compressive stress to the semiconductor substrate 3 in the pMOS region. Also, the stress liner film (stress applying layer) 53 is so formed as to have a sufficient depth d1' from the surface of the semiconductor substrate 3.

Assuming that d1' denotes the depth of the stress liner film (stress applying layer) 53 from the surface of the semiconductor substrate 3 and d2 denotes the depth of the recess 3a in which the gate insulating film 5 and the gate electrode 7 are buried (or the depth of the channel part ch), then the relation of [d2]<[d1'] should hold. The optimal depth d2 of the channel part ch should be experimentally established so that a maximum stress is applied to the channel part ch as in the first embodiment.

Incidentally, according to the fourth embodiment, it is desirable that the bottom of the recess 3a be positioned within the thickness of the stress liner film (stress applying layer) 53 or between the surface of the stress liner film (stress applying layer) 53 and the position (back side) of the depth d1'.

Also, according to the fourth embodiment, the silicide film 13 may be formed as the stress applying layer that applies stress to the channel part ch of the semiconductor substrate 3 under the gate electrode 7. In this way the stress applying layer is constructed in the form of laminate structure composed of the silicide film 13 and the stress liner film 53.

In this case, too, as in the first embodiment, the silicide film 13 is formed from a silicide of cobalt (Co), nickel (Ni), or platinum (Pt). The silicide film 13 of such composition functions as the stress applying layer that applies tensile stress to the semiconductor substrate 3. It can be favorably used for the field-effect transistor of n-channel type. On the other hand, if the silicide film 13 is one which applies a compressive stress, the semiconductor device 1-4 having it is favorably used for the field-effect transistor of p-channel type.

As in the first embodiment, the gate insulating film 5 and the gate electrode 7 are of damascene gate structure, and the gate electrode 7 has the insulating side walls 9. In this structure, the interlayer insulating film 15, which covers the semiconductor substrate 3 and the silicide film (stress applying layer) 13, has the groove pattern 17 whose side walls are defined by the side walls 9. The bottom of the groove pattern 17 is at the bottom of the recess 3a which has been formed by digging the semiconductor substrate 3. The gate insulating film 5 is so formed as to cover the inner wall of the groove pattern 17, and the gate electrode 7 is so formed as to fill the groove pattern 17, with the gate insulating film 5 interposed therebetween.

Incidentally, the semiconductor device 1-4 may be one which is optionally covered with the upper layer insulating film 19. In this case, the structure may be modified such that the connecting hole 21 reaching the silicide film (stress applying layer) 13 is formed in the upper layer insulating film 19 and the interlayer insulating film 15 and the wiring 23 is formed which is connected to the source-drain diffusion layer 11 through the silicide film (stress applying layer) 13 at the bottom of the connecting hole 21.

As in the first embodiment, the gate insulating film 5 should preferably be formed from a high dielectric (High-K) material in order to reduce the effective film thickness while maintaining the physical film thickness. The high dielectric material is the same one as used in the first embodiment.

The gate electrode 7 is identical in structure and material with that in the first embodiment.

In the semiconductor device 1-4 constructed as mentioned above, too, the channel part ch, which is adjacent to the interface with the gate insulating film 5 in the semiconductor substrate 3, is formed deep from the surface of the semiconductor substrate 3 within the thickness of the stress applying layer which is composed of the silicide film 13 and the stress liner film 53 in laminate structure.

The consequence of this structure is that stress applied to that part of the semiconductor substrate 3 which corresponds to the thickness of the stress applying layer composed of the stress liner film 53 and the silicide film 13 is concentrated to the channel part ch positioned half way in the depthwise direction of the stress applying layer. Thus the foregoing structure permits stress to be applied to the channel part ch from the stress applying layer more effectively than the structure in related art in which the channel part is at approximately the same height as the surface of the semiconductor substrate 3.

As a result, the carrier mobility is improved regardless of the concentration of the material constituting the stress applying layer. And this contributes to the improved performance of the semiconductor device 1-4.

Method for Production of the Semiconductor Device According to the Fourth Embodiment FIGS. 9A to 9J are sectional views showing the steps of the method for producing the semiconductor device 1-4 according to the fourth embodiment which has been explained above with reference to FIG. 8. The following describes the production method according to the fourth embodiment with reference to these figures and the sectional views used for description of the production method according to the first embodiment.

The initial steps are identical with those in the first embodiment which have been explained above with reference to FIGS. 2A to 2G.

Figure 9A:
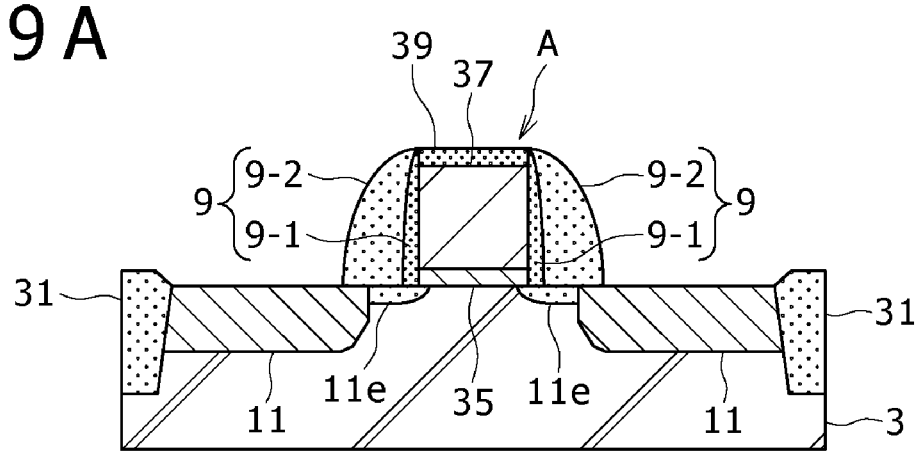
FIGS. 9A to 9J are sectional views showing a first example of the production method according to the fourth embodiment.

The result of the initial steps is shown in FIG. 9A. The semiconductor substrate 3 of single crystal silicon is separated by the isolation 31 formed in the surface thereof. The dummy gate structure A is formed, which is composed of the hard mask layer 39, dummy gate electrode film 37, and dummy gate insulating film 35, formed by pattern etching into the shape of the gate electrode. On the sides of the dummy gate structure A are formed the side wall 9, which is composed of the insulating first side wall 9-1 and the outer second side wall 9-2. Under the side wall 9 is formed the source-drain diffusion layer 11 having the extension 11e.

Figure 9B:
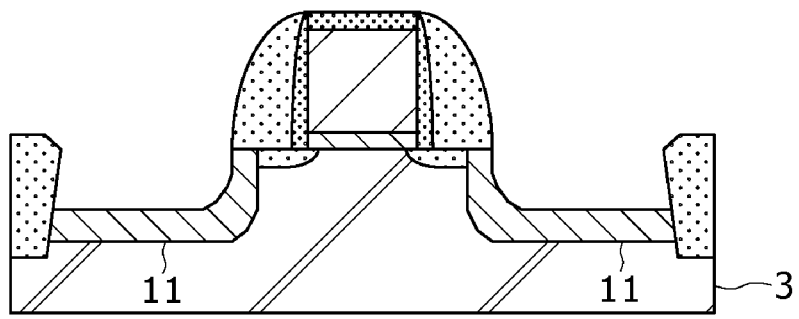

The next step shown in FIG. 9B is to dig by recess etching the exposed surface of the semiconductor substrate 3 or the exposed surface of the source-drain diffusion layer 11. Since the surface of the dug recess determines the depth of the stress liner film to be formed later, it is important to dig the semiconductor substrate 3 to a sufficient depth within the depth of the source-drain diffusion layer 11.

Figure 9C:
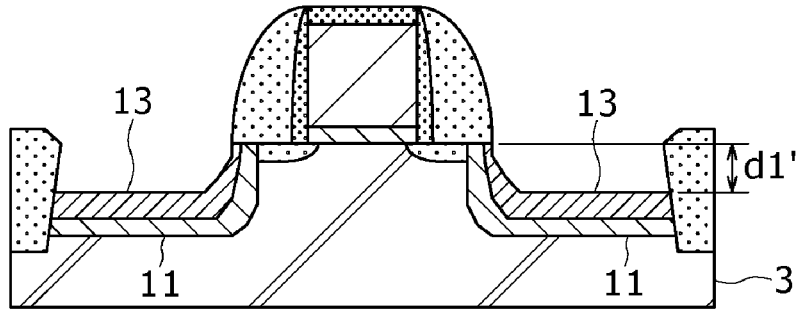

The next step shown in FIG. 9C is to form the silicide film 13 (as the stress applying layer) of such metal as cobalt (Co), nickel (Ni), and platinum (Pt) on the source-drain diffusion layer 11 by salicide process. This silicide film 13 reduces the contact resistance of the source-drain diffusion layer 11. As the silicide forming process proceeds, the silicide film 13 grows also on the recess surface, which is the phenomenon that occurs on the surface of the source-drain diffusion layer 11 or the surface of the semiconductor substrate 3 of single crystal silicon. Therefore, the surface of the thus grown silicide film 13 becomes the depth d1' of the stress liner film to be formed later.

Figure 9D:
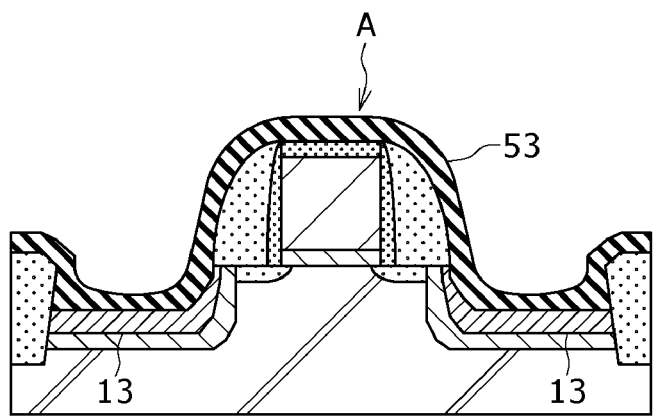

The next step shown in FIG. 9D is to form the stress liner film 53 in such a way as to bury therein the dummy gate structure A and the silicide film (stress applying layer) 13. The stress liner film 53 produces tensile stress for the nMOS region and compressive stress for the pMOS region. The stress liner film 53 is formed in the following way.

The stress liner film 53 that produces tensile stress for the nMOS region is a silicon nitride film formed by plasma CVD. Such a silicon nitride film is formed from $N_2$ gas (500 to 2000 sccm), $NH_3$ gas (500 to 1500 sccm), and $SiH_4$ gas (50 to 300 sccm), which are fed into the film-forming atmosphere kept at 5 to 15 Torr. The reaction conditions are such that the substrate temperature is 200 to 400° C. and the RF power is 50 to 500 W. The film-forming step is followed by UV (ultraviolet) irradiation (by a UV lamp at a power of 1 to 10 kW) in a He gas stream (10 to 20 slm) at 400 to 600° C. and 5 to 15 Torr. In this way there is obtained the stress liner film 53 of silicon nitride (about 40 nm thick) which produces a tensile stress of about 1.2 GPa. Incidentally, the thickness and tensile stress of the stress liner film 53 are not restricted to those mentioned above.

The stress liner film 53 that produces compressive stress for the pMOS region is a silicon nitride film formed by plasma CVD. Such a silicon nitride film is formed from $N_2$ gas (500 to 2500 sccm), Ar gas (1000 to 5000 sccm), $NH_3$ gas (50 to 200 sccm), and trimethylsilane gas (10 to 50 sccm), which are fed into $H_2$ gas (1000 to 5000 sccm) as the film-forming atmosphere. The reaction conditions are such that the substrate temperature is 400 to 600° C., the pressure of the film-forming atmosphere is 1 to 5 Torr, and the RF power is 50 to 500 W. In this way there is obtained the stress liner film 53 of silicon nitride (about 40 nm thick) which produces a compressive stress of about 1.2 GPa. Incidentally, the thickness and compressive stress of the stress liner film 53 are not restricted to those mentioned above.

Figure 9E:
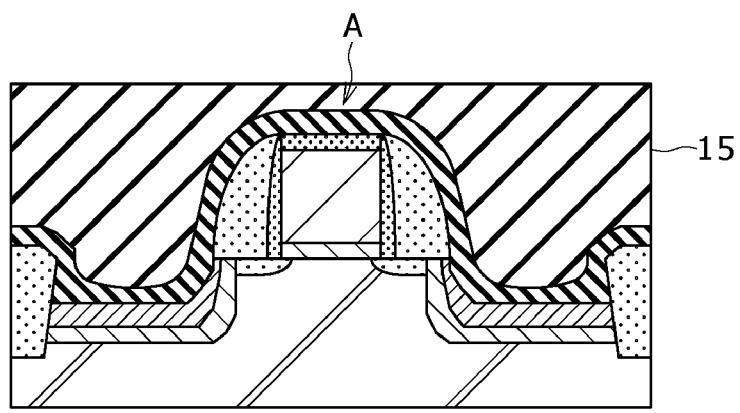

The next step shown in FIG. 9E is to form the interlayer insulating film 15 of silicon oxide in such a way as to bury therein the dummy gate structure A.

Figure 9F:
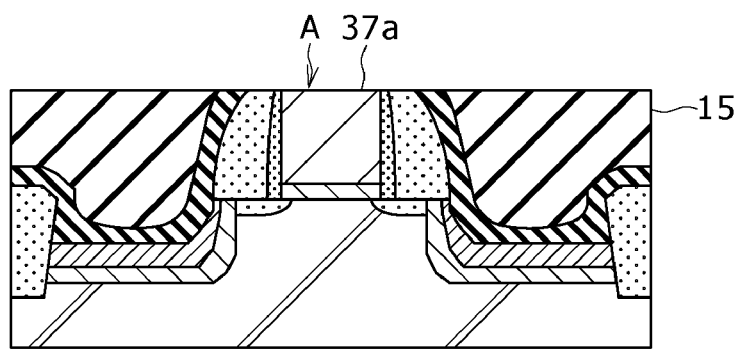

The next step shown in FIG. 9F is to polish the surface of the interlayer insulating film 15 by CMP process until the dummy gate electrode 37a of the dummy gate structure A exposes itself.

Figure 9G:
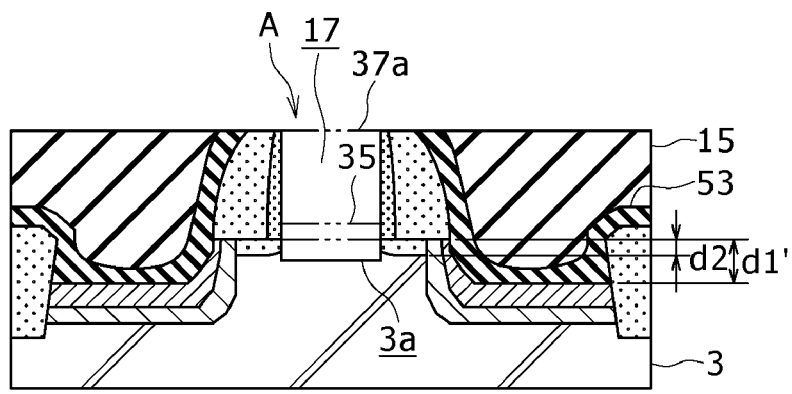

The next step shown in FIG. 9G is to remove by dry etching the dummy gate electrode 37a of polysilicon or amorphous silicon and then remove by wet etching the dummy gate insulating film 35 of silicon oxide. In this way, the groove pattern 17 is formed after removal of the dummy gate structure A in the interlayer insulating film 15 that covers the semiconductor substrate 3. Then, recess etching is performed to dig the exposed surface of the semiconductor substrate 3 at the bottom of the groove pattern 17.

Assuming that d1' denotes the depth of the stress liner film (stress applying layer) 53 from the surface of the semiconductor substrate 3 and d2 denotes the depth of the recess 3a (or the depth of the channel part ch), then the relation of [d2]<[d1'] should hold. The optimal value of the channel depth d2 of the recess 3a in this range should be experimentally established so that a maximum stress is applied to the channel part of the MOS transistor (field effect transistor).

Incidentally, here it is desirable that recess etching should be performed such that the recess 3a is positioned within the thickness of the stress liner (stress applying layer) 53 or between the surface of the stress liner film (stress applying layer) 53 and the position (back side) of the depth d1'.

Figure 9H:
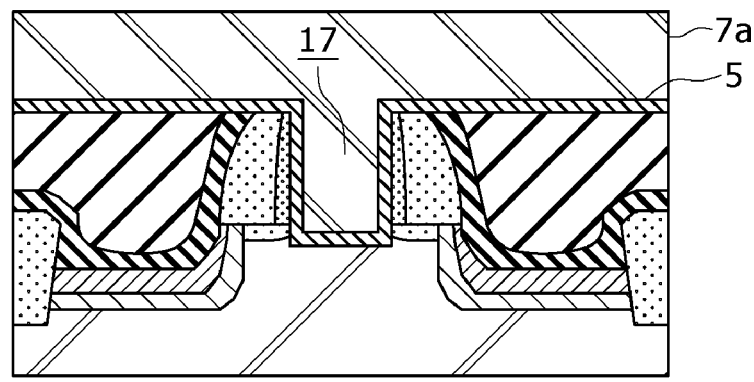

The next step shown in FIG. 9H is to form the gate electrode material film 7a, with the gate insulating film 5 interposed, in such a way as to fill the inside of the groove pattern 17. It is desirable that the gate insulating film 5 should be formed by CVD or ALD process from a high-dielectric material mentioned above. Then, the gate electrode material film 7a is formed, with the gate insulating film 5 interposed, in such a way as to fill the inside of the groove pattern 17. Here, the gate electrode material film 7a is formed by CVD, PVD, or ALD process from a metal layer for the metal gate. The gate electrode material film 7a may be of single layer structure or laminate structure. It may be formed from any material mentioned in the section describing the device according to the first embodiment.

Figure 9I:
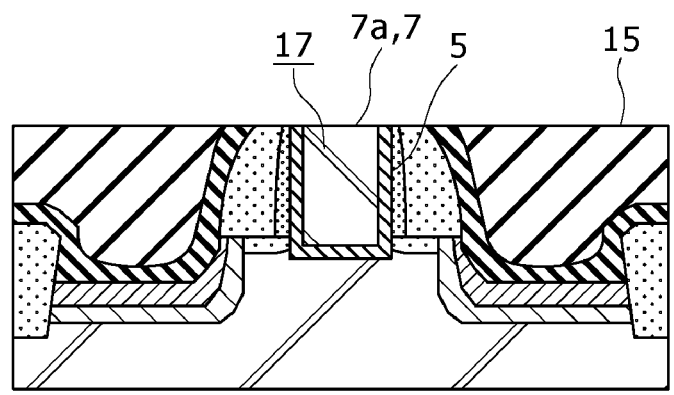

The next step shown in FIG. 9I is to polish by CMP the gate electrode material film 7a and the gate insulating film 5 until the interlayer insulating film 15 exposes itself. In this way the gate electrode 7 is formed in the groove pattern 17, with the gate insulating film 5 interposed, while the gate electrode material film 7a remains unremoved.

Figure 9J:
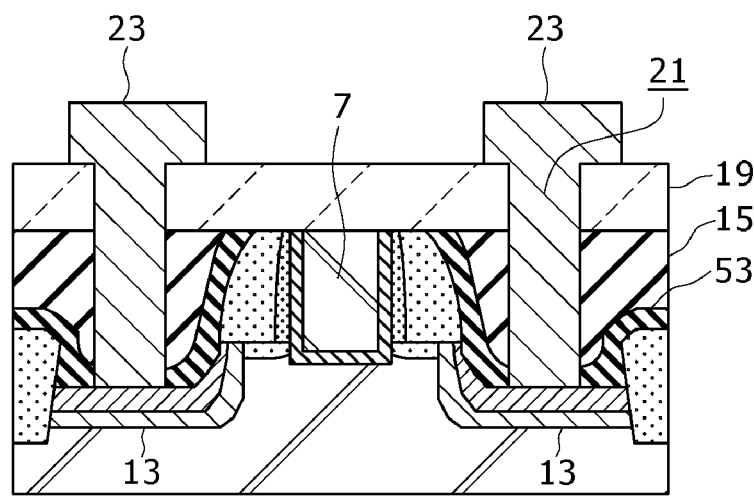

The step just mentioned above may be followed by an optional step of forming the upper layer insulating film 19 of silicon oxide in such a way as to cover the interlayer insulating film 15 and the gate electrode 7, as shown in FIG. 9J. Then, the connecting hole 21, which reaches the silicide film 13, is formed in the upper layer insulating film 19, the interlayer insulating film 15, and the stress liner film 53. Further, the plug that fills the connecting hole 21 and the wiring 23 for its connection are formed.

The forgoing steps yield the semiconductor device 1-4 which has been described above with reference to FIG. 8. It has the gate electrode 7 which is formed in the recess 3a dug in the surface of the semiconductor substrate 3, with the gate insulating film 5 surrounding it. It also has the stress liner film 53 which is formed deep from the surface of the semiconductor substrate 3 in such a way as to cover the surface of the silicide film 13 on the source-drain diffusion layer 11 adjacent to both sides of the gate electrode 7.

The above-mentioned production method also offers the following advantages. As explained with reference to FIG. 9G, the dummy gate structure A is removed while the stress liner film (stress applying layer) 53 remains. Therefore, the stress that is applied to that part of the semiconductor substrate 3 which is under the dummy gate structure A from the stress liner film (stress applying layer) 53 is not weakened by the counteraction from the dummy gate electrode 37a. As a result, the stress from the stress liner film (stress applying layer) 53 is effectively applied to the channel part ch.

The semiconductor substrate 3 at the bottom of the groove pattern 17, with the dummy gate structure A removed, is dug down further, so that the channel part ch is positioned deep from the surface of the semiconductor substrate 3. As a result, the channel part ch concentratedly receives the stress which is applied to that part of the semiconductor substrate 3 within the stress liner film (stress applying layer) 53 in the depthwise direction of the stress liner film (stress applying layer) 53. Therefore, the resulting semiconductor device 1-4 is constructed such that the stress from the stress liner film (stress applying layer) 53 is effectively and concentratedly applied to the channel part ch.

The production method according to the fourth embodiment has been described above. It includes the steps of forming the groove pattern 17, digging by recess etching the semiconductor substrate 3 at its bottom, and forming the recess 3a in the semiconductor substrate 3. However, the production method according to the third embodiment can be applied to the semiconductor device according to the fourth embodiment in which the stress liner film 53 functions as the stress applying layer. It includes the steps of forming the recess 3a by previously performing recess etching on the semiconductor substrate 3 and subsequently forming the groove pattern 17 after the forming of the gate insulating film 5. Incidentally, in this case, as explained for the third embodiment with reference to FIG. 6G, the procedure is composed of forming the source-drain diffusion layer 11, digging the surface of the source-drain diffusion layer 11, and forming thereon the stress applying layer of the insulating stress liner film by digging the surface thereof.

The foregoing procedure makes it possible to produce the semiconductor device in which the gate insulating film is not formed on the upper part of the side wall of the groove pattern 17. Therefore, as explained for the third embodiment, the gate insulating film 5 formed from a high-dielectric material does not exist between the gate electrode 7 and the wiring 23, and this produces the effect of preventing the device performance from deteriorating due to parasitic capacity between the gate electrode 7 and the wiring 23.

Structure of the Semiconductor Device According to the Fifth Embodiment

Figure 10:
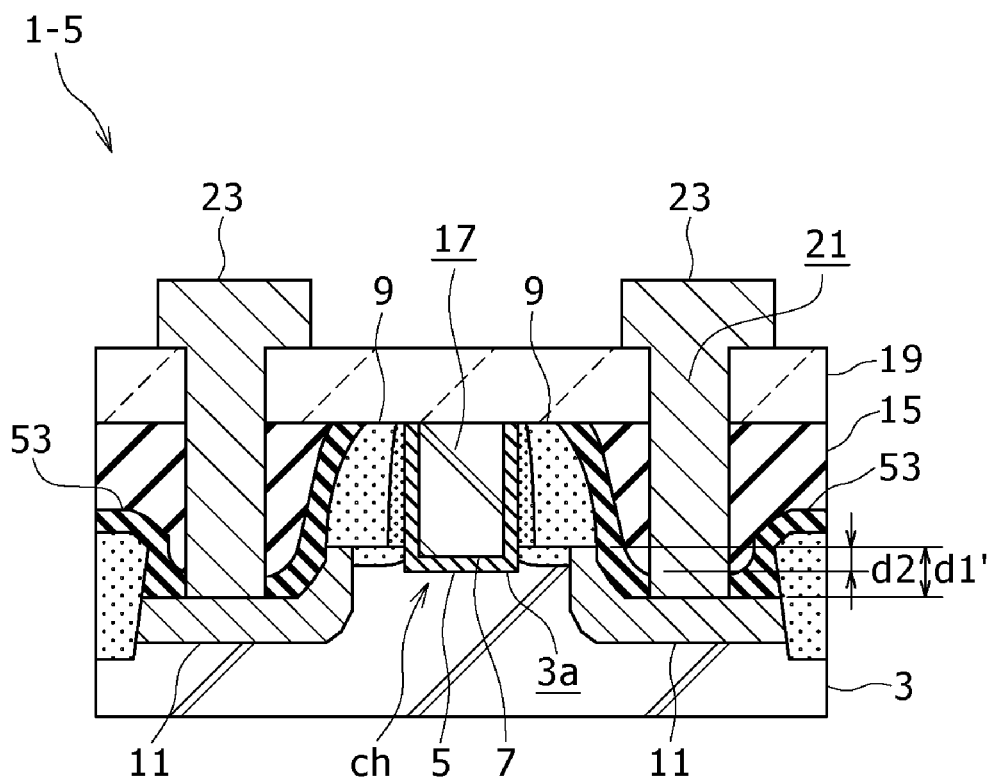
FIG. 10 is a sectional view showing a semiconductor device according to a fifth embodiment.
Figure 11:
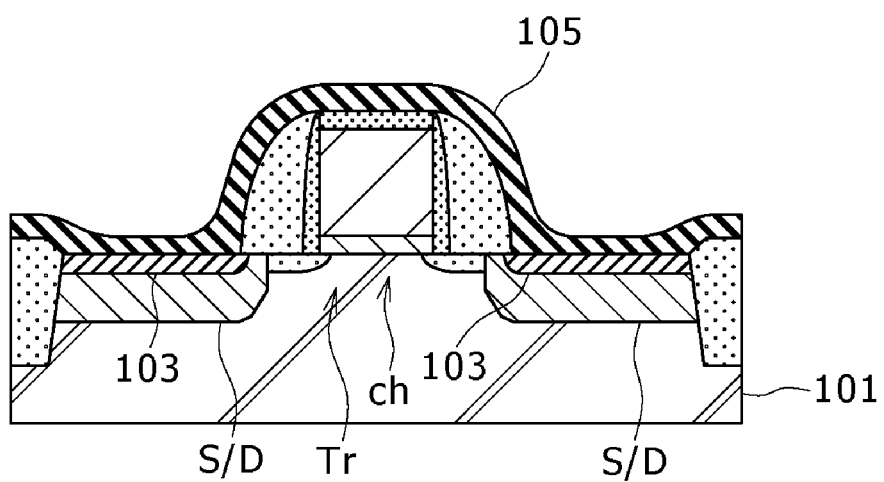
FIG. 11 is a sectional view showing one example of semiconductor devices in related art.

FIG. 10 is a sectional view showing important parts of the semiconductor device 1-5 according to the fifth embodiment of the present invention. The semiconductor device 1-5 shown in this figure differs from that according to the fourth embodiment shown in FIG. 8 in that the silicide film 13 is not formed on the surface of the source-drain diffusion layer 11 but the stress liner film 53 is formed directly on the top of the source-drain diffusion layer 11. Except for these differences, it is identical with that according to the fourth embodiment.

As in the fourth embodiment, the stress liner film 53 functions as the stress applying layer that applies stress to the channel part ch of the semiconductor substrate 3 under the gate electrode 7. It is formed from silicon nitride, for example. Any material will be selected that applies tensile stress to the semiconductor substrate 3 in the nMOS region or that applies compressive stress to the semiconductor substrate 3 in the pMOS region. Also, the stress liner film (stress applying layer) 53 is so formed as to have a sufficient depth d1' from the surface of the semiconductor substrate 3.

Assuming that d1' denotes the depth of the stress liner film (stress applying layer) 53 from the surface of the semiconductor substrate 3 and d2 denotes the depth of the recess 3a in which the gate insulating film 5 and the gate electrode 7 are buried (or the depth of the channel part ch), then the relation of [d2]<[d1'] should hold, as in the fourth embodiment. Incidentally, as in the fourth embodiment, it is desirable that the bottom of the recess 3a be positioned within the thickness of the stress liner film (stress applying layer) 53 or between the surface of the stress liner film (stress applying layer) 53 and the position (back side) of the depth d1'.

The method for production of the semiconductor device 1-5 according to the fifth embodiment is identical with that explained in the section for the fourth embodiment except that the step for forming the silicide film 13 is omitted.

The semiconductor device 1-5 constructed as mentioned above produces the same effect as the one according to the fourth embodiment. If it has a silicide film of cobalt (Co), nickel (Ni), or platinum (Pt), which is in common use, in the nMOS region and pMOS region, the silicide film 13 applies tensile stress to the semiconductor substrate 3. Therefore, in the case of field-effect transistor of p-channel type, the stress liner film does not effectively apply compressive stress. However, according to the fifth embodiment, in which the silicide film is omitted, the stress liner film 53 effectively applies compressive stress.

The present application contains subject matter related to that disclosed in Japanese Priority Patent Application JP 2008-169793 filed in the Japan Patent Office on Jun. 30, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor device comprising:
    a gate electrode formed in a recess dug in a surface of a semiconductor substrate, with a gate insulating film interposed between said gate electrode and said semiconductor substrate;
    a pair of source-drain diffusion layers formed on the surface of said semiconductor substrate and that are adjacent to both sides of said gate electrode;

a pair of stress applying layers, each covering the surface of a corresponding source-drain diffusion layer of the pair of source-drain diffusion layers; and a pair of extension layers, each extending from a corresponding source-drain diffusion layer of the pair of source-drain diffusion layers, wherein, the bottom of the recess is positioned deeper than the bottom of the pair of extension layers from the surface of the semiconductor substrate, and the bottom of the recess is positioned shallower than the bottom of the pair of stress applying layers from the surface of the semiconductor substrate.

2. The semiconductor device as defined in claim 1, wherein each of said pair of stress applying layers includes a silicide film which has been grown on the surface of the corresponding source-drain diffusion layer.

3. The semiconductor device as defined in claim 1, wherein each of said pair of stress applying layers includes a stress liner film formed from an insulating material and formed on the corresponding source-drain diffusion layer.

4. The semiconductor device as defined in claim 3, wherein said stress liner film as a constituent of said stress applying layer continuously covers an area extending from said source-drain diffusion layer to a side wall of said gate electrode.

5. The semiconductor device as defined in claim 1, wherein each of said pair of stress applying layers has a laminate structure composed of a silicide film which has been grown on the surface of the corresponding source-drain diffusion layer and a stress liner film formed thereon from an insulating material.

6. The semiconductor device as defined in claim 5, wherein said stress liner film as a constituent of said stress applying layer continuously covers an area extending from said source-drain diffusion layer to a side wall of said gate electrode.

7. The semiconductor device as defined in claim 1, wherein:

a groove pattern is formed by digging in said semiconductor substrate and an insulating film thereon in such a way that the bottom part of the groove pattern is said recess, and said gate electrode is so formed as to fill said groove pattern, with said gate insulating film interposed between the gate electrode and the groove pattern and that covers at least the exposed surface of said semiconductor substrate.

8. The semiconductor device as defined in claim 7, wherein said gate insulating film completely covers an inner wall of the groove pattern including the bottom part of said groove pattern.

9. The semiconductor device as defined in claim 7, wherein said gate insulating film covers only part of an inner wall of the groove pattern.

10. The semiconductor device as defined in claim 1, wherein said gate insulating film contains an oxide, oxysilicide, oxynitride, or oxynitridesilicide containing at least one species selected from aluminum (Al), yttrium (Y), zirconium (Zr), lanthanum (La), hafnium (Hf), and tantalum (Ta).

11. The semiconductor device as defined in claim 1, wherein said gate electrode has a laminate structure which includes a work function regulating layer to adjust the work function of said gate electrode.

12. The semiconductor device as defined in claim 11, wherein said work function regulating layer is in contact with said gate insulating film.

* * * * *